(12) United States Patent
Pani et al.

(10) Patent No.: US 8,242,807 B2
(45) Date of Patent: *Aug. 14, 2012

(54) SCALABLE NON-BLOCKING SWITCHING NETWORK FOR PROGRAMMABLE LOGIC

(75) Inventors: Peter M. Pani, Mountain View, CA (US); Benjamin S. Ting, Saratoga, CA (US)

(73) Assignee: Advantage Logic, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/165,668

(22) Filed: Jun. 21, 2011

(65) Prior Publication Data

US 2011/0248744 A1 Oct. 13, 2011

Related U.S. Application Data

(63) Continuation of application No. 12/955,738, filed on Nov. 29, 2010, now Pat. No. 7,986,163, which is a continuation of application No. 12/794,685, filed on Jun. 4, 2010, now Pat. No. 7,863,932, which is a continuation of application No. 12/472,305, filed on May 26, 2009, now Pat. No. 7,768,302, which is a continuation of application No. 12/174,080, filed on Jul. 16, 2008, now Pat. No. 7,557,613, which is a continuation of application No. 11/823,257, filed on Jun. 26, 2007, now Pat. No. 7,417,457, which is a continuation of application No. 11/218,419, filed on Sep. 1, 2005, now Pat. No. 7,256,614, which is a continuation of application No. 10/814,943, filed on Mar. 30, 2004, now Pat. No. 6,975,139.

(51) Int. Cl.
*H03K 19/177* (2006.01)
*H01L 21/82* (2006.01)

(52) U.S. Cl. ............ 326/41; 326/47; 326/101; 438/128; 438/129; 257/209

(58) Field of Classification Search .............. 326/38–41, 326/47, 101; 438/128–132; 257/202, 209
See application file for complete search history.

(56) References Cited

U.S. PATENT DOCUMENTS 4,020,469 A 4/1977 Manning
(Continued)

FOREIGN PATENT DOCUMENTS

EP 0415542 3/1991
(Continued)

OTHER PUBLICATIONS

Office Action for U.S. Appl. No. 10/814,943 mailed Sep. 27, 2005.
(Continued)

*Primary Examiner* — Vibol Tan
(74) *Attorney, Agent, or Firm* — Lowenstein Sandler PC

(57) ABSTRACT

A scalable non-blocking switching network (SN) having switches and intermediate (stages of) conductors that are used to connect a first plurality of conductors to other multiple sets of conductors in a generally unrestricted fashion within respective interconnect resources constraints. The SN can be applied in a wide range of applications, in tandem or hierarchically, to provide a large switch network used in network, routers, and programmable logic circuits. The SN is used to connect a first set of conductors, through the SN, to multiple sets of conductors in a given logic circuit hierarchy whereby the conductors in each of the multiple sets are equivalent or exchangeable, which in term, by construction, makes the first set of conductors equivalent when used in the next level of circuit hierarchy. The SN is scalable for large sized sets of conductors and can be used hierarchically to enable programmable interconnections among large sized circuits.

9 Claims, 13 Drawing Sheets

U.S. PATENT DOCUMENTS

| | | |
|---|---|---|
| 4,661,901 A | 4/1987 | Veneski |
| 4,700,187 A | 10/1987 | Furtek |
| 4,720,780 A | 1/1988 | Dolecek |
| 4,736,333 A | 4/1988 | Mead et al. |
| 4,758,745 A | 7/1988 | Elgamal |
| 4,815,003 A | 3/1989 | Putatunda et al. |
| 4,847,612 A | 7/1989 | Kaplinsky |
| 4,870,302 A | 9/1989 | Freeman |
| 4,912,342 A | 3/1990 | Wong et al. |
| 4,918,440 A | 4/1990 | Furtek |
| 4,935,734 A | 6/1990 | Austin |
| 4,992,680 A | 2/1991 | Benedetti et al. |
| 5,122,685 A | 6/1992 | Chan |
| 5,144,166 A | 9/1992 | Camarota et al. |
| 5,187,393 A | 2/1993 | Elgamal et al. |
| 5,204,556 A | 4/1993 | Shankar |
| 5,208,491 A | 5/1993 | Ebeling et al. |
| 5,221,865 A | 6/1993 | Phillips et al. |
| RE34,363 E | 8/1993 | Freeman |
| 5,243,238 A | 9/1993 | Kean |
| 5,256,918 A | 10/1993 | Suzuki |
| 5,260,610 A | 11/1993 | Pederson et al. |
| 5,260,611 A | 11/1993 | Cliff et al. |
| 5,296,759 A | 3/1994 | Sutherland et al. |
| 5,298,805 A | 3/1994 | Garverick et al. |
| 5,329,470 A | 7/1994 | Sample et al. |
| 5,349,691 A | 9/1994 | Harrison et al. |
| 5,369,314 A | 11/1994 | Patel et al. |
| 5,376,844 A | 12/1994 | Pederson et al. |
| 5,396,126 A | 3/1995 | Britton et al. |
| 5,406,525 A | 4/1995 | Nicholes |
| 5,444,394 A | 8/1995 | Watson et al. |
| 5,455,525 A | 10/1995 | Ho et al. |
| 5,457,410 A | 10/1995 | Ting |
| 5,469,003 A | 11/1995 | Kean |
| 5,477,067 A | 12/1995 | Isomura et al. |
| 5,485,103 A | 1/1996 | Pederson et al. |
| 5,519,629 A | 5/1996 | Snider |
| 5,537,057 A | 7/1996 | Leong et al. |
| 5,550,782 A | 8/1996 | Cliff et al. |
| 5,552,722 A | 9/1996 | Kean |
| 5,572,148 A | 11/1996 | Lytle et al. |
| 5,581,199 A | 12/1996 | Pierce et al. |
| 5,581,767 A | 12/1996 | Katuski et al. |
| 5,815,004 A | 9/1998 | Trimberger et al. |
| 5,818,254 A | 10/1998 | Agrawal et al. |
| 5,825,202 A | 10/1998 | Tavana |
| 5,835,405 A | 11/1998 | Tsui et al. |
| 5,841,775 A | 11/1998 | Huang |
| 5,850,564 A | 12/1998 | Ting et al. |
| 5,880,597 A | 3/1999 | Lee |
| 5,883,526 A | 3/1999 | Reddy et al. |
| 5,894,228 A | 4/1999 | Reddy |
| 5,903,165 A | 5/1999 | Jones et al. |
| 5,914,616 A | 6/1999 | Young |
| 6,016,063 A | 1/2000 | Trimberger |
| 6,034,547 A | 3/2000 | Pani et al. |
| 6,038,627 A | 3/2000 | Plants |
| 6,051,991 A | 4/2000 | Ting |
| 6,088,526 A | 7/2000 | Ting et al. |
| 6,160,420 A | 12/2000 | Gamal |
| 6,163,168 A | 12/2000 | Nguyen et al. |
| 6,181,162 B1 | 1/2001 | Lytle et al. |
| 6,292,022 B2 | 9/2001 | Young |
| 6,417,694 B1 | 7/2002 | Reddy et al. |
| 6,433,580 B1 | 8/2002 | Ting |
| 6,507,217 B2 | 1/2003 | Ting |
| 6,594,810 B1 | 7/2003 | Reblewski et al. |
| 6,597,196 B2 | 7/2003 | Ting |
| 6,670,825 B1 | 12/2003 | Lane et al. |
| 6,686,768 B2 | 2/2004 | Comer |
| 6,693,456 B2 | 2/2004 | Wong |
| 6,829,237 B2 | 12/2004 | Carson et al. |
| 6,940,308 B2 | 9/2005 | Wong |
| 7,012,448 B2 | 3/2006 | Parkes |
| 7,065,076 B1 | 6/2006 | Nemazie |
| 7,123,612 B2 | 10/2006 | Lu |
| 7,420,390 B1 | 9/2008 | Hutton et al. |
| 7,440,449 B2 | 10/2008 | Carson et al. |
| 7,460,529 B2 | 12/2008 | Pani et al. |
| 7,705,629 B1 | 4/2010 | Pani et al. |
| 7,714,611 B1 | 5/2010 | Pani et al. |
| 7,777,519 B2 | 8/2010 | Pani et al. |
| 7,830,173 B2 | 11/2010 | Pani et al. |
| 7,876,126 B2 | 1/2011 | Pani et al. |
| 7,986,163 B2 * | 7/2011 | Pani et al. ............... 326/41 |
| 7,999,570 B2 * | 8/2011 | Kim ............... 327/218 |
| 8,106,682 B2 * | 1/2012 | Pani et al. ............... 326/41 |
| 2001/0007428 A1 | 7/2001 | Young |
| 2002/0163357 A1 | 11/2002 | Ting |
| 2004/0150422 A1 | 8/2004 | Wong |

FOREIGN PATENT DOCUMENTS

| | | |
|---|---|---|
| EP | 0630115 A2 | 6/1994 |
| GB | 2180382 | 3/1987 |
| GB | 2295738 | 5/1996 |
| WO | 9208286 | 5/1992 |
| WO | 9410754 | 5/1994 |
| WO | 9428475 | 12/1994 |
| WO | 9504404 | 2/1995 |
| WO | 9528769 | 10/1995 |
| WO | 9605964 | 4/1996 |
| WO | 9635261 | 11/1996 |
| WO | WO 03/032492 | 4/2003 |

OTHER PUBLICATIONS

Office Action for U.S. Appl. No. 11/218,419 mailed Jun. 20, 2007.
Office Action for U.S. Appl. No. 11/218,419 mailed May 24, 2007.
Office Action for U.S. Appl. No. 11/823,257 mailed May 22, 2008.
Office Action for U.S. Appl. No. 12/174,080 mailed Apr. 23, 2009.
Office Action for U.S. Appl. No. 12/472,305 mailed Jan. 14, 2010.
Office Action for European Patent Application No. 05724178.8, filed Feb. 28, 2005, mailed Jun. 14, 2010, 4 pages.
PCT Search Report mailed Aug. 31, 2005, International Application No. PCT/US05/06583, International Filing Date Feb. 28, 2005, 8 pages.
EP Communication 05724178.8-2215 (PCT/US2005006583) dated Jul. 26, 2007 and Supplementary European Search Report (date of completion of the search Jul. 19, 2007), 05724178.8-2215 (PCT/US2005006583).
Notice of Allowance and Fees Due mailed Mar. 24, 2010 for U.S. Appl. No. 12/472,305, filed May 26, 2009, 6 pages.

* cited by examiner

SCALABLE NON-BLOCKING SWITCHING NETWORK FOR PROGRAMMABLE LOGIC

REFERENCE TO RELATED APPLICATIONS

This is a continuation application of application Ser. No. 12/955,738, filed Nov. 29, 2010, now U.S. Pat. No. 7,986,163 which is a continuation of U.S. patent application Ser. No. 12/794,685, filed Jun. 4, 2010, now U.S. Pat. No. 7,863,932 which is a continuation application of Ser. No. 12/472,305, now U.S. Pat. No. 7,768,302, filed May 26, 2009, which is a continuation application of Ser. No. 12/174,080, now U.S. Pat. No. 7,557,613, filed Jul. 16, 2008, which is a continuation application of Ser. No. 11/823,257, now U.S. Pat. No. 7,417,457, filed Jun. 26, 2007, which is a continuation application of Ser. No. 11/218,419, now U.S. Pat. No. 7,256,614, filed Sep. 1, 2005, which is a continuation of Ser. No. 10/814,943, now U.S. Pat. No. 6,975,139, filed Mar. 30, 2004, which are hereby incorporated by reference.

TECHNICAL FIELD

Embodiments of this invention relate to switching networks and, in particular to switching networks used with programmable logic circuits.

BACKGROUND

A programmable logic circuit, also referred to as field programmable gate array (FPGA) is an off the shelf integrated logic circuit which can be programmed by the user to perform logic functions. Circuit designers define the desired logic functions and the circuit is programmed to process the signals accordingly. Depending on logic density requirements and production volumes, programmable logic circuits are superior alternatives in terms of cost and time to market. A typical programmable logic circuit is composed of logic cells where each of the logic cells can be programmed to perform logic functions on its input variables. Additionally, interconnect resources are provided throughout the programmable logic circuit which can be programmed to conduct signals from outputs of logic cells to inputs of logic cells according to user specification.

As technology progresses to allow for larger and more sophisticated programmable logic circuits, both the number of logic cells and the required interconnect resources increases in the circuit. Competing with the increased number of logic cells and interconnect resources is the need to keep the circuit size small. One way to minimize the required circuit size is to minimize the interconnect resources while maintaining a certain level of connectivity. Therefore, it can be seen that as the functionality implemented on the chip increases, the interconnection resources required to connect a large number of signals can be quickly exhausted. The trade-offs are either to provide for a lower utilization of logic cells in a circuit while keeping the circuit size small or to provide more routing resources that can increase the circuit size dramatically.

There has been a progression of increasingly complex connection styles over the last forty years in the field of programmable logic circuits. L. M. Spandorfer in 1965 describes possible implementation of a programmable logic circuit using neighborhood interconnection, and connections through multiple conductors using switches in a Clos network. R. G. Shoup in his PhD thesis of 1970 describes both the use of a neighborhood interconnect and the use of a bus for longer distance interconnect.

Freeman in the U.S. Pat. No. 4,870,302 of 1989 describes a commercial implementation of a FPGA using neighborhood interconnects, short (length one, called single) distance interconnects, and global lines for signals such as clocks. The short distance interconnects interact with the inputs and outputs of logic cells where each input is connected through switches to every short wire neighboring to a logic cell and horizontal and vertical short wires connect through a switch box in a junction. El Gamal et al. in U.S. Pat. No. 4,758,745 introduces segmented routing where inputs and outputs of logic cells interact with routing segments of different lengths in one dimension.

Peterson et al. in U.S. Pat. No. 5,260,610 and Cliff et al. in U.S. Pat. No. 5,260,611 introduce a local set of conductors interfacing with a set of logic elements where every input of the logic elements is connected, through switches, to every local conductor in the set; additional chip length conductors are introduced both horizontally and vertically where the horizontal conductor can connect to the vertical conductors and the horizontal conductors connect to multiple local conductors. In U.S. Pat. Nos. 4,870,302, 4,758,745, 5,260,610, and 5,260,611, the input conductor of a logic cell has full connections to the set of local conductors (e.g. for n-inputs and k-local conductors, there is n×k switches connecting the inputs to the local conductors. A multiplexer (MUX) scheme may also be used so that the number of transistors is reduced.). In U.S. Pat. Nos. 4,870,302, 4,758,745, 5,260,610, and 5,260,611, the general interconnect resources are limited to one or two different lengths (i.e. singles of U.S. Pat. No. 4,870,302, local and chip length in U.S. Pat. Nos. 5,260,610 and 5,260,611) or limited in one dimension (i.e. different lengths horizontally in U.S. Pat. No. 4,758,745, local vertically in U.S. Pat. Nos. 5,260,610 and 5,260,611).

Camarota et al. in U.S. Pat. No. 5,144,166 and Kean in U.S. Pat. No. 5,469,003 introduce a routing scheme with more than two different lengths in both dimensions with limitations in the reach of those conductors. While U.S. Pat. No. 5,144,166 allows each wire to be selectively driven by more than one possible driving source, U.S. Pat. No. 5,469,003 is limited to be unidirectional in that each wire is hardwired to a MUX output. The connectivity provided in both U.S. Pat. Nos. 5,144,166 and 5,469,003 are very low, based on the premises that either connections are neighborhood or relatively local, or logic cells itself can be used as interconnection resources instead of performing logic functions. Ting in U.S. Pat. Nos. 5,457,410, 6,507,217, 6,051,991, 6,597,196 describe a multiple level architecture where multiple lengths of conductors interconnect through switches in a hierarchy of logic cells.

Young et al. in U.S. 2001/0007428 and U.S. Pat. No. 5,914,616 describe an architecture with multiple lengths of wires in two dimensions (three in each dimension) where for short local connections, a near cross-bar scheme is used where a set of logic cells outputs are multiplexed to a reduced set of output ports which then interface to other interconnect resources. The longer wires generally fan-in into shorter length wires in a respective dimension. Reddy et al. in U.S. Pat. No. 6,417,694 discloses another architecture where inter-super-region, inter-region, and local conductors are used. A cross-bar scheme is used at the lowest level (using MUXs) for the local wires to have universal access to the inputs of the logic elements. Reddy et al. in U.S. Pat. No. 5,883,526 discloses various schemes having circuit reduction techniques in the local cross-bar.

At the base level of circuit hierarchy, four-input Look Up Table (LUT) logic cells are commonly used. There are two advantages in using a LUT as the base logic cell. One advantage is that the circuit allows any four-input, one output Boolean functions with programmable controls. Another advantage is that the four inputs are exchangeable and logically equivalent. Hence it does not matter which signal connecting to which input pin of the LUT for the LUT to function correctly as long as those four signals connect to the four inputs of the LUT.

A common problem to be solved in any programmable logic circuit is that of interconnectivity, namely, how to connect a first set of conductors carrying signals to multiple sets of conductors to receive those signals where the logic cells originating the signals and the logic cells receiving the signals are spread over a wide area in an integrated circuit (i.e., M outputs of M logic cells where each output connects to inputs of multiple number of logic cells). A highly desirable but in most cases impractical solution is to use a cross bar switch where every conductor of the first set is connectable to every conductor in the multiple sets of conductors directly through a switch. Prior solutions in one degree or another try to divide the connectivity problem into multiple pieces using a divide and conquer strategy where local clusters of logic cells are interconnected and extended to other clusters of logic, either through extensions of local connections or using longer distance connections. These prior interconnect schemes are ad hoc and mostly based on empirical experiences. A desired routing model or interconnect architecture should guarantee full connectability for a large number of inputs and outputs (through programmable interconnect conductors) connecting to multiple sets of conductors over a large part of the circuit all the time.

Complicated software is necessary to track interconnect resources while algorithms are used to improve interconnectability during the place and route stage implementing a custom design using the programmable logic circuit. Thus, it is desirable to have a new interconnect scheme for programmable logic circuits where the routability or interconnectability may be guaranteed in a more global scale while the cost of interconnections remains low in terms of required switches and the software efforts in determining a place and route for custom design implementation are simplified.

BRIEF DESCRIPTION OF THE DRAWINGS

The objectives, features, and advantages of the present invention will be apparent from the following detailed description in which.

DETAILED DESCRIPTION

Figure 1:
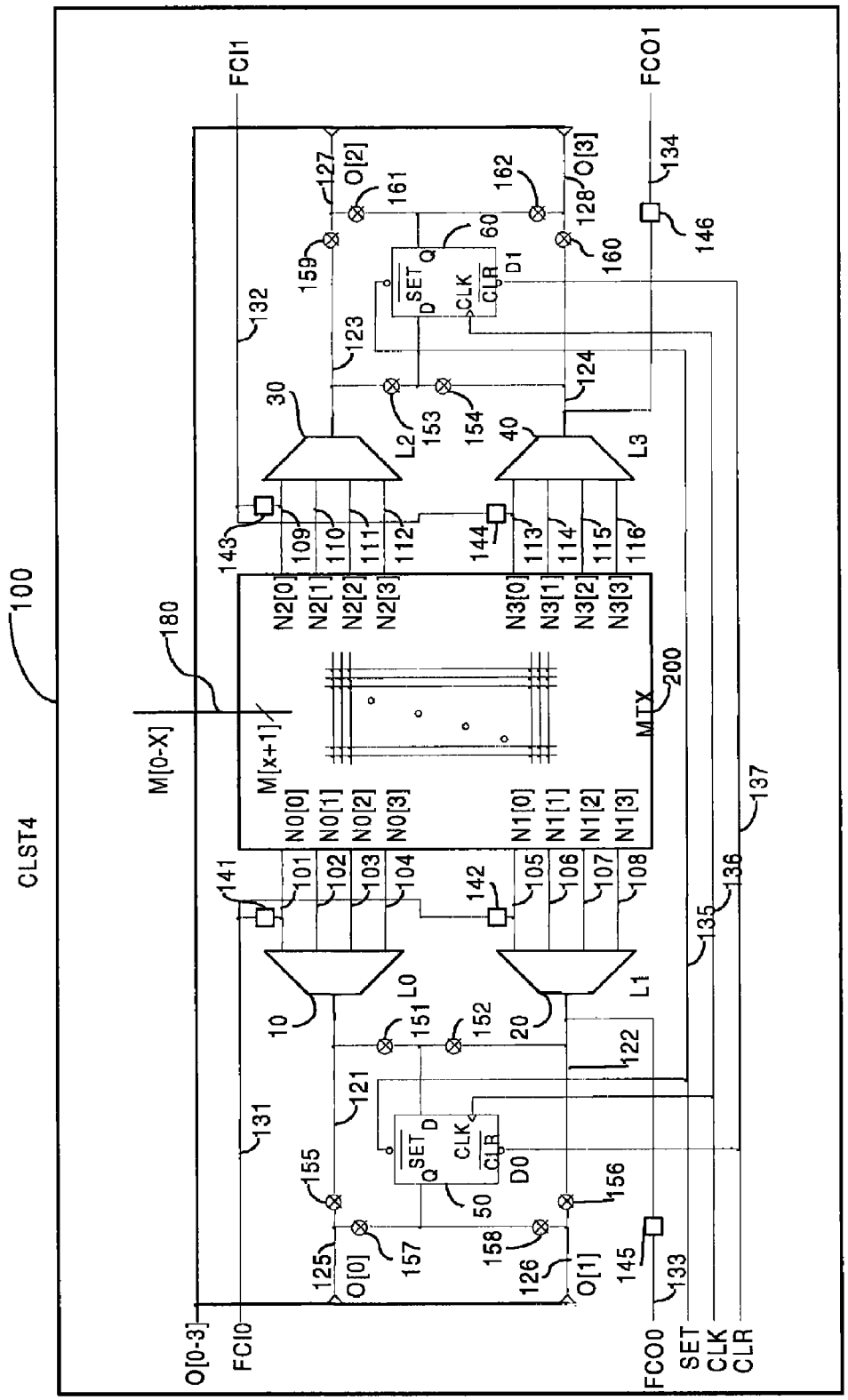
FIG. 1 illustrates an embodiment of a circuit with four four-input logic cells and two flip flops using a scalable non-blocking switching network (SN).

An innovative scalable non-blocking switching network (SN) which uses switches and includes intermediate stage(s) of conductors connecting a first plurality of conductors to multiple sets of conductors where each conductor of the first plurality of conductors is capable of connecting to one conductor from each of the multiple sets of conductors through the SN, is first described. The scalable non-blocking switching network can be applied in a wide range of applications, when used, either in a single stage, or used hierarchically in multiple stages, to provide a large switch network used in switching, routers, and programmable logic circuits. A scalable non-blocking switching network is used to connect a first set of conductors, through the SN, to multiple sets of conductors whereby the conductors in each of the multiple sets are equivalent or exchangeable, for example, the conductors of one of the multiple sets are the inputs of a logic cell (which can be the inputs of a LUT or inputs to a hierarchy of logic cells). The scalable non-blocking switching network in this present invention allows any subset of a first set of conductors to connect, through the SN, to conductors of a second multiple sets of conductors, so that each conductor of the subset can connect to one conductor from each set of the multiple sets of conductors.

In the following description, for purposes of explanation, numerous specific details are set forth in order to provide a thorough understanding of the present invention. It will be apparent to one skilled in the art that embodiments of the present invention may be practiced without these specific details. In other instances, well-known structures and circuits are shown in block diagram form in order to avoid unnecessarily obscuring the present invention. For purpose of description, unless otherwise specified, the terms program controlled switch and switch are interchangeable in the context of this description: the terms program configured logic cell, logic cell, cell, Look Up Table (LUT), programmable logic cell are interchangeable in the context of this description; the terms conductor, signal, pin, port, line are interchangeable in the context of this description. It should also be noted that the present invention describes embodiments which use program control means to set the states of switches utilized, this control means can be one time, such as fuse/antifuse technologies, or re-programmable, such as SRAM (which is volatile), FLASH (which is non-volatile), Ferro-electric (which is non-volatile), etc. Hence the present invention pertains to a variety of processes, including, but not limited to, static random access memory (SRAM), dynamic random access memory (DRAM), fuse/anti-fuse, erasable programmable read-only memory (EPROM), electrically erasable programmable read-only memory (EEPROM) such as FLASH, and Ferro-electric processes.

The concept of scalable non-blocking switching networks utilized in a programmable logic circuit described herein can be generally applied to allow unrestricted connections between a plurality of conductors to multiple sets of conductors, as long as the connection requirements do not exceed the available conductors.

When a program controlled switch is used to interconnect one conductor to another conductor, a driver circuit may be coupled to the switch to improve the speed of the signal traversing those conductors. Additionally, if multiple conductors (signals) fan-in to a conductor through program controlled switches, it is possible to use a MUX scheme, if desired, to either reduce loading on the conductor or to reduce circuit size, or both, depending on the process technology used. In the case where a MUX is used, the multiple switches are converted into a new switch mechanism where, the number of effective states are the same as the number of switches, connectivity is enabled by choosing the particular state (corresponding to the switch if multiple switches were used) in connecting two conductors and the states are determined by programmable control.

Various types of scalable non-blocking switching networks are described including, but not limited to: stage-0 scalable non-blocking switching network (0-SN), stage-1 scalable non-blocking switching network (1-SN), stage-2 scalable non-blocking switching network (2-SN) and extensions to multi-stage scalable non-blocking switching networks and the use of those scalable non-blocking switching networks hierarchically in providing interconnectivity to programmable logic circuits.

FIG. 1 shows an embodiment of a cluster (CLST4) circuit 100 including a scalable non-blocking switching network 200 and including k number of four-input logic cells (where k=4 in this embodiment) 10, 20, 30 and 40 and two Flip-Flops 50 and 60. Each of the logic cells 10-40 has four inputs 101-104 (N0[0-3]) for cell 10, four inputs 105-108 (N1[0-3]) for cell 20, four inputs 109-112 (N2[0-3]) for cell 30 and four inputs 113-116 (N3[0-3]) for cell 40, with four conductors 121-124 as the four outputs for cells 10-40 respectively. Switches 151-156 and 159, 160 are used to control whether a logic cell output drives a Flip-Flop or the logic cell outputs to circuit 100 outputs 125-128 directly. The Flip-Flops 50, 60 output to circuit 100 outputs 125-128 using switches 157, 158, 161 and 162. Additionally, conductor 131 can drive conductor 101 of cell 10 through switch 141 and conductor 105 of cell 20 through switch 142. Similarly, conductor 132 can drive cells 30 and 40 through switches 143 and 144, respectively. Cell 20 can drive a neighboring CLST4 circuit (not shown in FIG. 1) through output 122 using switches 145 to conductor 133. Output 124 of cell 40 drives out to conductor 134 through switch 146 in FIG. 1. Three other signals 135-137 are used to control the Flip-Flops as SET, CLOCK, and CLEAR, respectively. Additionally, FIG. 1 has (X+1) conductors 180 (M[0-X]) fanning in to drive the sixteen inputs 101-116 using a switch network MTX 200. The conductors M[0-X] 180 are called M conductors where M is equal to the number of conductors (X+1) in the embodiment of FIG. 1. The input conductors Ni[0-3] for i=[0-(k-1)] 101-116 are called the Ni conductors where Ni is equal to the number of inputs which is four in the embodiment of FIG. 1. For purpose of illustration, the size Ni=N=4 is shown in FIG. 1. Alternatively, each Ni can have a different size without changing the connectivity property described herein.

Figure 2:
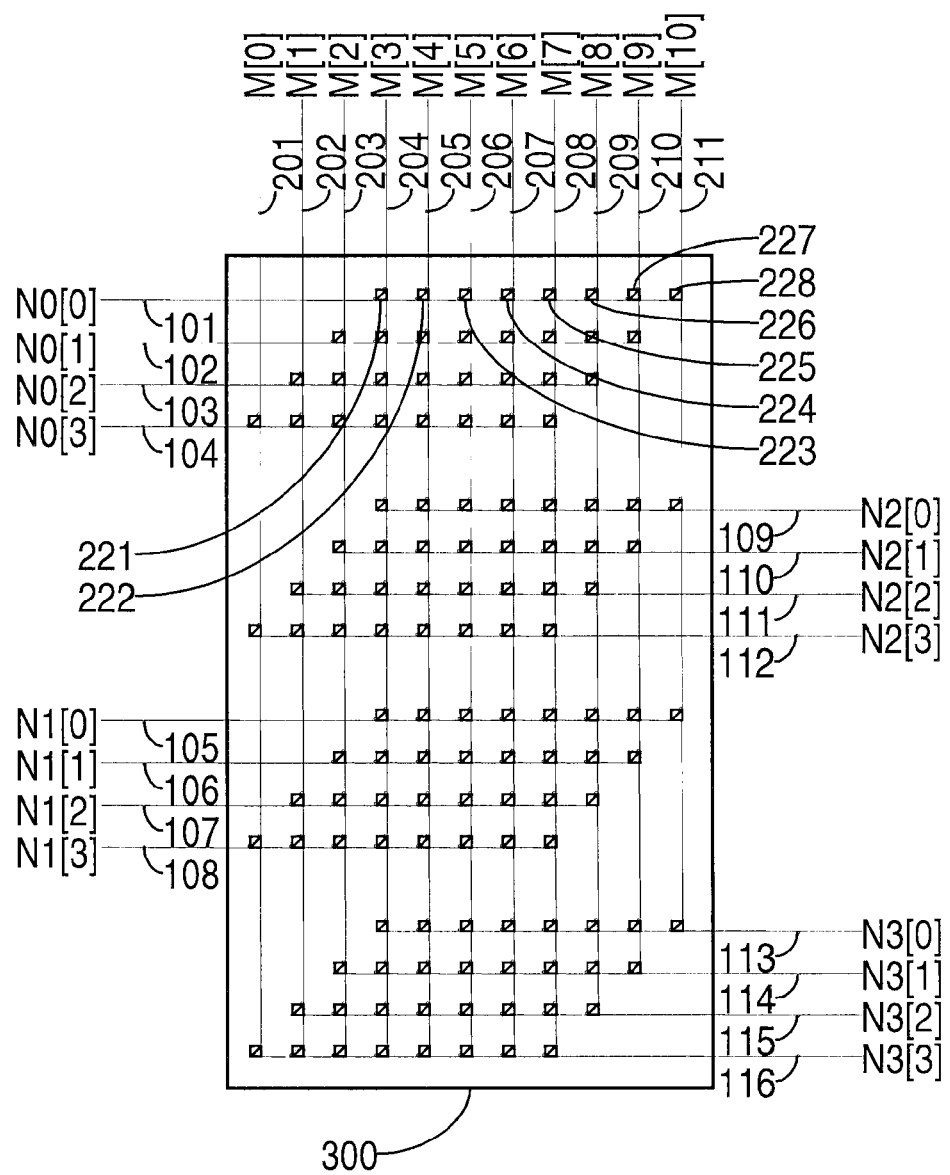
FIG. 2 illustrates one embodiment of a circuit using a stage-0 scalable non-blocking switching network (0-SN) with eleven M conductors accessing four sets of four N conductors.

FIG. 2 shows an embodiment where MTX 200 of FIG. 1 is represented by a stage-0 scalable non-blocking switching network (0-SN) 300; each N conductor 101-116 is connectable to (M-N+1) conductors of the M conductors (e.g., conductors 180 of FIG. 1) 201-211 (M[0-10]), the number of switches shown in FIG. 2 for each input conductor of conductors 101-116 is thus (M-N+1)=8 for the 0-SN 300 of FIG. 2. The switch network 0-SN 300 allows any subset of M conductors 201-211 to drive one input conductor of each of the logic cells 10-40 using the switches of 300 without any blocking as long as the number of connections do not exceed the available interconnect resources (i.e., the number of M conductors driving the inputs of any of the logic cells can not exceed the number of inputs of the logic cell). The scheme of FIG. 2 is an improvement over a cross bar connection where instead of a full switch matrix comprising M×(k×N)=11×(4×4)=176 switches, the number of switches is (M-N+1)×(k×N)=128. The 0-SN 300 in FIG. 2 allows the above stated connectivity by assuming the four inputs for each of the logic cells as exchangeable or logically equivalent (i.e., conductors 101-104 of cell 10 of FIG. 1 are equivalent or exchangeable) so it is only necessary to connect a particular M conductor (i.e. M[4] conductor 205) to any input pin of a given logic cell (i.e., conductor 101 out of conductors 101-104 of cell 10 of FIG. 1 using switch 222) if the connection requirement is to connect the particular M conductor to the given logic cell.

Depending on technology used in the programmable circuits, some area minimization can be accomplished. For example, using a SRAM memory cell with six transistors as the program control for each switch implemented using a passgate, the eight switches 221-228 of FIG. 2 per input line 101 will require fifty six transistors. Instead, an eight input MUX using three memory bits can be used to control eight states to effectively replace the eight SRAM bits and eight switches. In the MUX scheme, three bits, fourteen passgates and perhaps one inverter (to regenerate the signal) uses thirty four transistors which is a large reduction from the fifty six transistors used with eight SRAM memory cells as the program control for each switch. The loading on conductor 101 will be reduced using the MUX implementation while there are additional delays due to the eight to one MUX.

Figure 3:
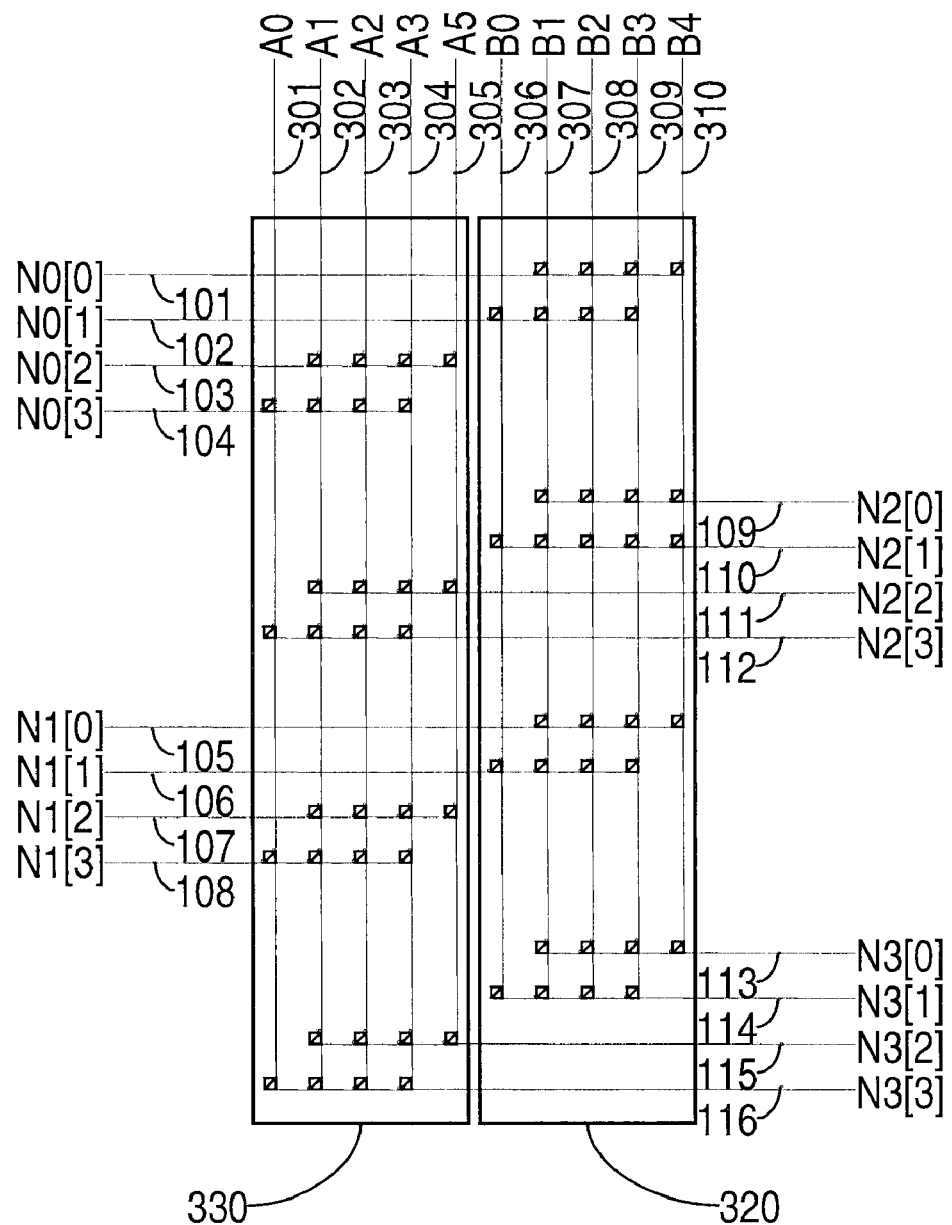
FIG. 3 illustrates one embodiment of a circuit using two stage-0 scalable non-blocking switching networks with each 0-SN having five M conductors accessing four sets of two N conductors.

FIG. 3 shows an embodiment where MTX 200 of FIG. 1 is represented by using two stage-0 scalable non-blocking switching networks 330 and 320 with M=Ma+Mb=10 conductors 301-310 composed of subgroups Ma=[A0-A4]=5 301-305 conductors and Mb=[B0-B4]=5 306-310 conductors. Each Nb=2 for the upper two input conductors of each of the four logic cells (composed of conductors 101-102 for cell 10, conductors 105-106 for cell 20, conductors 109-110 for cell 30 and conductors 113-114 for cell 40) and Na=2 for the lower two input conductors for each of the k=four logic cells (composed of conductors 103-104 for cell 10, conductors 107-108 for cell 20, conductors 111-112 for cell 30 and conductors 115-116 for cell 40). A full sized stage-0 scalable non-blocking switching network of FIG. 3 would have (M-N+1)=10-4+1=7 program controlled switches per input conductor. Instead, in the embodiment of FIG. 3, the number of input switches is only four because of the separate $M_a$ conductors and Mb conductors (with Ma=Mb=5) and the number N is broken into two parts (with Na=Nb=2). As such, the number of program controlled switches per input conductor in network 330 is Ma-Na+1=5-2+1=4 and the use of program controlled switches per input conductor in network 320 is Mb-Nb-1=4. While it is true that the Ma 301-305 conductors connecting to the lower two inputs of the four logic cells using network 330 maintain the connectivity illustrated in FIG. 2 (and similar for Mb conductors 306-310 to the lower two inputs of the four logic cells using network 320), it is not true that any arbitrary use of [A0-A4], [B0-B4] to fan-in to the four logic cells is so. This constraint prevents arbitrary assignments of M conductors connecting to the N conductors through the two 0-SNs 320 and 330 of FIG. 3. However, the stage-0 scalable non-blocking switching networks 320 and 330 together can be an economic implementation to provide good connectivity for a programmable logic circuit while the software efforts in book-keeping and tracking the allowable M conductors usage are more complex than the scheme of FIG. 2. FIG. 3 allows at least eight M conductors out of ten to be arbitrarily connected to the inputs of the four logic cells, where each one conductor connecting to one input to each of the four logic cells using networks 320 and 330; the constraint here is that the ten conductors can not be arbitrarily assigned as in the FIG. 2 case.

In embodiments of the present invention, a first group of conductors is connected to multiple groups of equivalent conductors using a switch network. Thus far a 0-SN has been presented, where there are (M−N+1)×N×k switches to provide unrestricted connections between a first set of M conductors to multiple k sets of N conductors where any subset of M conductors can connect to one conductor to each of the k sets of N conductors using the 0-SN without any blockage.

Figure 4:
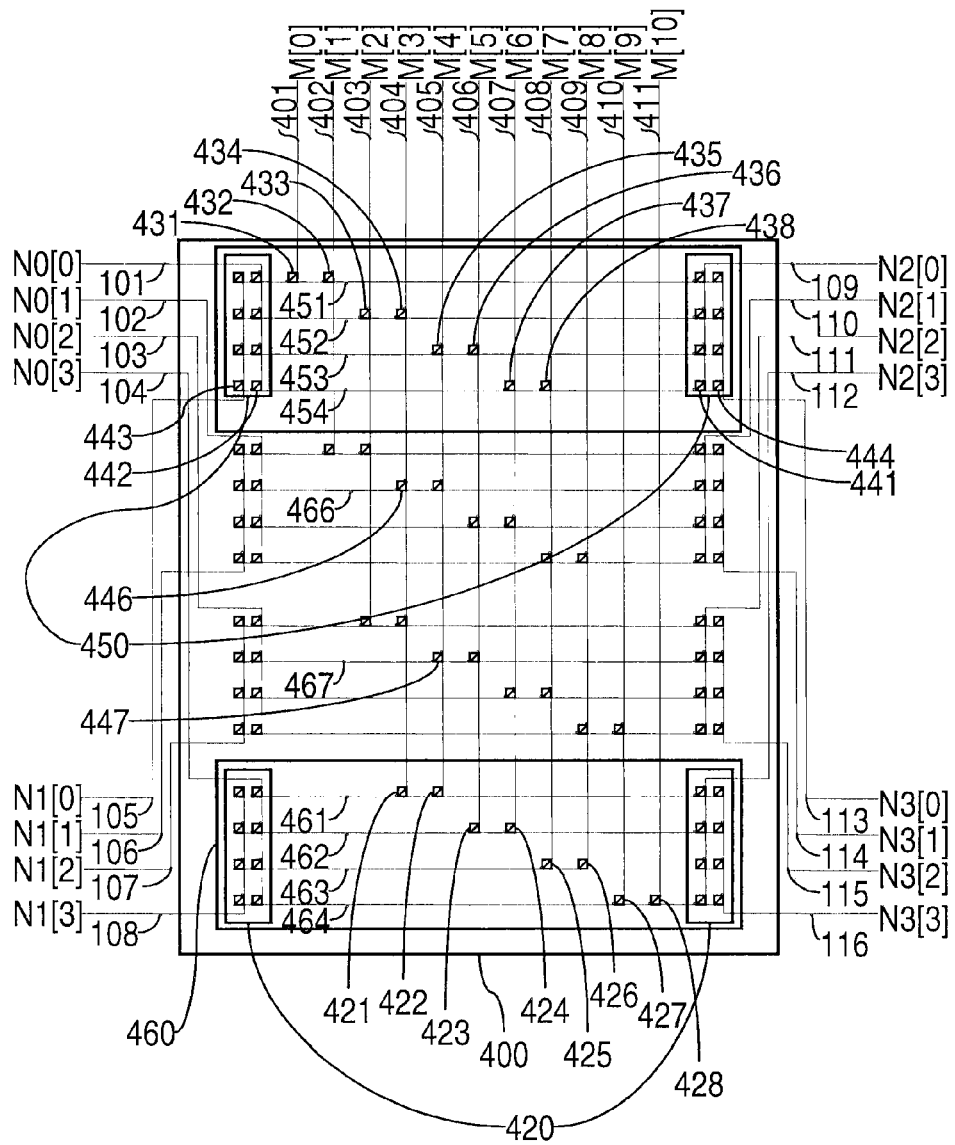
FIG. 4 illustrates one embodiment of a circuit using a stage-1 scalable non-blocking switching network (1-SN) with eleven M conductors accessing four sets of four N conductors through N sets of four intermediate conductors.

FIG. 4 illustrates an alternative embodiment scheme where the number of switches used in the switch network can be greatly reduced without changing the connectivity property of the 0-SN. FIG. 4 shows an embodiment where MTX 200 of FIG. 1 is represented by using a stage-1 scalable non-blocking switching network (1-SN). The 1-SN 400 connects a M conductor of conductors 401-411 to a N conductor of conductors 101-116 using two switches of the 1-SN 400 plus one intermediate conductor. Instead of directly connecting the M conductors 201-211 to the k sets of N conductors 101-116 through the network 300 of FIG. 2 where 128 switches are used, the 1-SN 400 in FIG. 4 connects a M conductor 407 (M[6]) to a N conductor 109 by first connecting to an intermediate I conductor 454 through switch 437 and then to the N conductor 109 through switch 441 of sub-network 450. Similarly, the same M conductor 407 can connect to N conductors 101, 105, and 113 through the same intermediate conductor 454 through switches 442, 443 and 444, respectively. The 1-SN 400 of FIG. 4 has ninety six switches which is a 25% reduction in the number of switches compared with the 0-SN 300 of FIG. 2. It is possible to reduce the number of switches required in a 0-SN by creating a scalable non-blocking switching network with intermediate stage(s) of interconnect where each of the M conductors can connect, arbitrarily, to a conductor from each of k sets of N conductors. The scalable non-blocking switching network is capable of connecting a M conductor to more than one conductor from each of k sets of N conductors; however, logically it is not necessary to connect to more than one conductor in each of the N conductors.

FIG. 4 illustrates a 1-SN 400 with N sets of intermediate conductors $I_i$ for i=[1−N], where there are eleven M conductors 401-411, four sets of N conductors, 101-104, 105-108, 109-112 and 113-116, and k is four. The first intermediate conductors $I_1$, for example, are the four conductors 451-454 that associate with the first input for each of the N conductors, thus conductors 101, 105, 109 and 113. Similarly, conductors 461-464 are the $I_4$ conductors associated with conductors 104, 108, 112, and 116. The (M−N+1) switches for each conductor of the N conductors in a 0-SN are distributed amongst the corresponding $I_i$ conductors in FIG. 4. For example, the eight switches 431-438 coupling the M conductors 401-408 are distributed to the $I_1$ conductors 451-454 where each of the conductors couples to [(M−N+1)/I$_1$] switches, which is two. In the example of FIG. 4, the number of intermediate conductors in each of the conductors is four. Generally, different need not be a uniform number (as described below). The 1-SN 400 of FIG. 4 has [(M−N+1)×N+sum$_{i=[1-N]}$ ($I_i$×k)]=32+64=96 switches where $I_i$ is the number of intermediate conductors in each of N sets of $I_i$ intermediate conductors. The 1-SN 400 of FIG. 4 allows the same connectivity property as the respective 0-SN 300 of FIG. 2, connecting any conductor of the M conductors to one conductor of each k sets of N conductors through two switches and one intermediate conductor in 1-SN 400.

In the 1-SN 400 of FIG. 4, any N-tuple of M conductors have the appropriate choice of switches to different N sets of conductors. For example, conductors 401, 404, 405, and 410 are the four-tuple (N=4) of M conductors where conductor 401 connects to conductor 451 (of the $I_1$ conductors) through switch 431; conductor 404 connects to conductor 466 (of the $I_2$ conductors) through switch 446; conductor 405 connects to conductor 467 (of the $I_3$ conductors) through switch 447; and conductor 410 connects to conductor 464 (of the $I_4$ conductors) through switch 427. Any subset of the N-tuple of M conductors has the same property connecting to the intermediate conductors. Additionally, each intermediate conductor of $I_i$ conductors is connectable to one N conductor in each of the k sets of N conductors. For example, any conductor of conductors 451-454 is connectable, through the switches in sub-network 450, to conductors 101, 105, 109 and 113. Similarly, any conductor of conductors 461-464 is connectable to conductors 104, 108, 112 and 116 through switches in sub-network 420.

Figure 5:
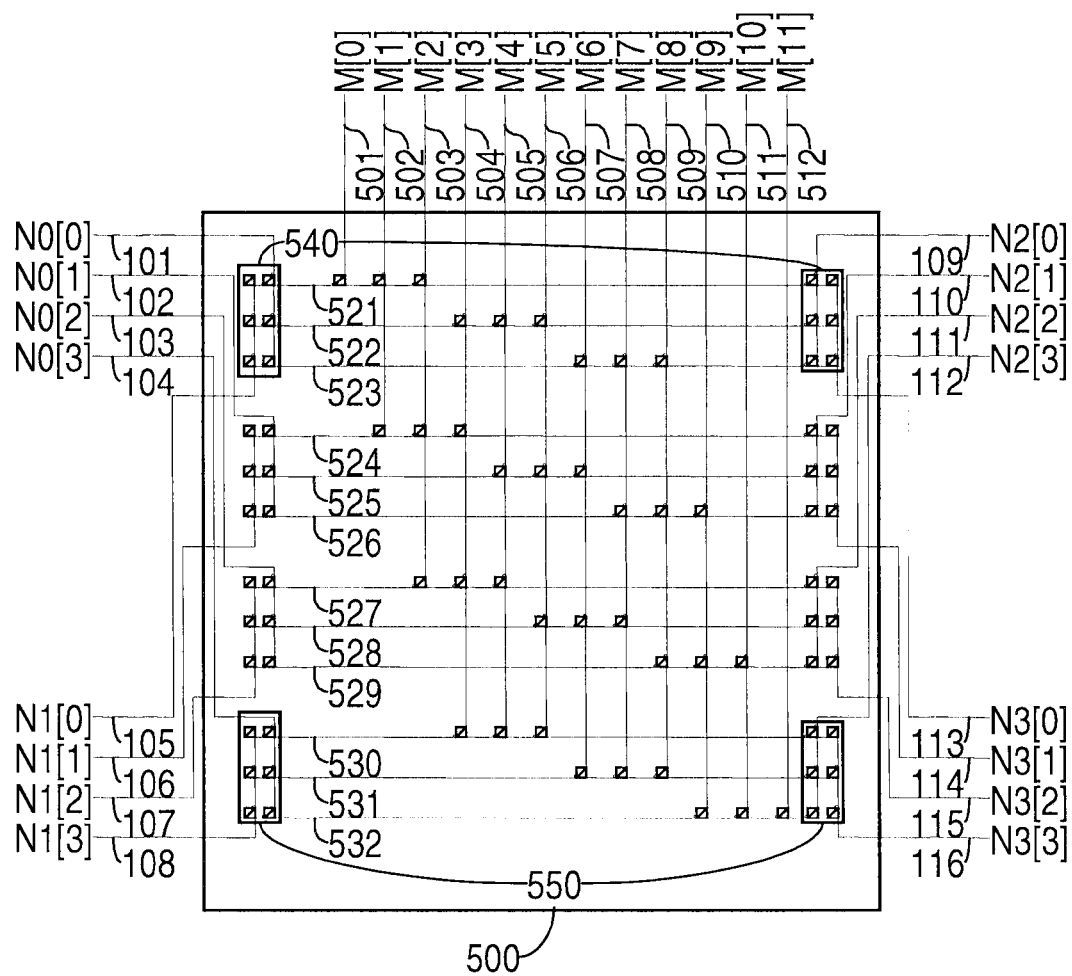
FIG. 5 illustrates one embodiment of a circuit using a stage-1 scalable non-blocking switching network with twelve M conductors accessing four sets of four N conductors through fewer intermediate conductors.

FIG. 5 illustrates an alternative embodiment of a 1-SN representing the MTX 200 of FIG. 1. In 1-SN 500 there are twelve M conductors 501-512, four sets of N conductors 101-116, and N sets of intermediate $I_i$ conductors 521-523, $I_2$ conductors 524-526, $I_3$ conductors 527-529, and $I_4$ conductors 530-532 where M=$I_1$+$I_2$+$I_3$+$I_4$ or $I_i$=M/N=3. The number of switches in FIG. 5 is [(M−N+1)×N+sum$_{i=[1-N]}$ ($I_i$×k)] =36+48=84. A corresponding 0-SN would have one hundred and forty four switches and a cross bar would have one hundred and ninety two switches. The connectivity property of the 1-SN 500 of FIG. 5 is the same as those discussed earlier with respect to 1-SN 400 of FIG. 4 with fewer intermediate conductors and switches. The illustrations in FIG. 4 and FIG. 5 have the first set of intermediate $I_1$ conductors (conductors 451-454 of FIG. 4 and conductors 521-523 of FIG. 5) connecting to conductors 101, 105, 109, 113, which are the first input of each of the four logic cells 10-40 of FIG. 1, through switches of sub-network 450 of FIG. 4 and switches of sub-network of 540 of FIG. 5, respectively. An equally effective alternative is to connect each set of $I_i$ conductors to any one conductor (instead of the $i^{th}$ one) from each of the four logic cells as long as each of the four inputs of a particular logic cell in this example are covered by a different set of $I_i$ conductors.

Figure 6:
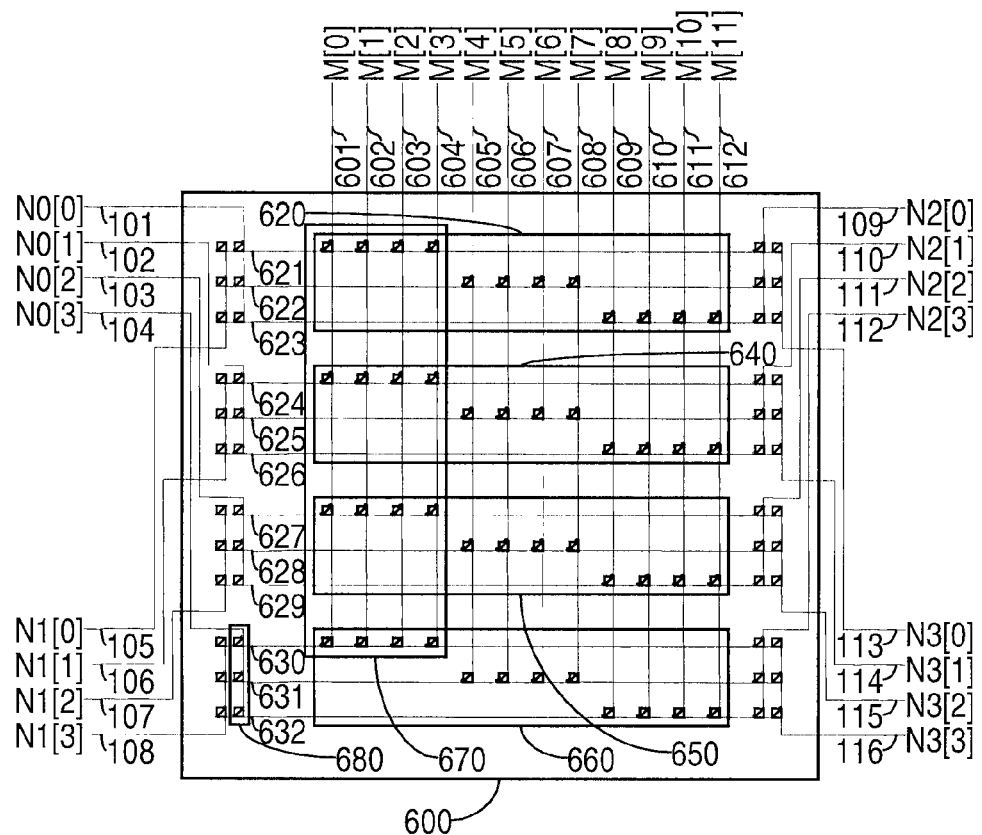
FIG. 6 illustrates one embodiment of a circuit using a stage-1 scalable non-blocking switching network with twelve M conductors accessing four sets of four N conductors with stronger connectivity property.

FIG. 6 illustrates an embodiment of a different version of a stage-1 scalable non-blocking switching network having a stronger connectivity property than the 1-SN 500 of FIG. 5. While requiring more switches, the twelve M conductors, 601-612 (M[0]-M[11]) of 1-SN 600 are connectable to all the conductors in each of the N sets of $I_i$ intermediate conductors 621-623, 624-626, 627-629, 630-632. This is in contrast to the coupling to (M−N+1) conductors of the M conductors in FIG. 4 and FIG. 5. In 1-SN 600, conductors 601-612 are connectable to $I_1$ conductors 621-623 through the switches in sub-network 620. Conductors 601-612 are connectable to $I_2$ conductors 624-626 through the switches in sub-network 640. Conductors 601-612 are connectable to $I_3$ conductors 627-629 through the switches in sub-network 650. Conductors 601-612 are connectable to $I_4$ conductors 630-632 through the switches in sub-network 660. The twelve M conductors 601-612 in FIG. 6 have a stronger connectivity property compared to the 1-SN 500 of FIG. 5 where one conductor of $M/I_i$ conductors can be program selected to connect to a specific N conductors of any of the k sets. As an example, in the embodiment of FIG. 6, any of N-tuples conductors 601-604, 605-608, 609-612 (of M conductors) can connect to any specific input conductor of any of the four (k=4) sets of N conductors using the 1-SN, but the conductors within each four-tuples are mutually exclusive to the specific input conductor. The number of switches required in this 1-SN 600 of FIG. 6 is $[M \times N + \text{sum}_{i=[1-N]} (I_i \times k)] = 48+48 = 96$ switches.

The difference between a 0-SN and a 1-SN in terms of switches required is the difference between $[(M-N+1) \times N \times k]$ and $[(M-N+1) \times N + \text{sum}_{i=[1-N]} (I_i \times k)]$ in the case of FIG. 5 where (M-N+1) of the M conductors are connectable through the 1-SN to the $I_i$ conductors in each of the N sets of conductors. The difference between a 0-SN and a 1-SN in terms of switches required is the difference between $[M \times N \times k]$ and $[M \times N + \text{sum}_{i=[1-N]} (I_i \times k)]$ in the case of FIG. 6. If we simplify each $I_i = k$, then M is at least $[k+N+1/(k-1)]$ for the case of FIG. 5 and M is at least $[k+1+1/(k-1)]$, it is worthwhile to note that the scheme of FIG. 5 still works for M to be less than the number(s) above. Additionally, in order for the scheme of a 1-SN to work, the number of switches per intermediate conductor $[(M-N+1)/I_i]$ may not be greater than N without loosing the non-blocking characteristics of the SN. The number, $[(M-N+1)/I_i]$, may not be an integer, in the case, an integer number $P_i$ is used by rounding the number $(M-N+1)/I_i$ up or down while the $\text{sum}_{i=[1-N]} P_i = (M-N+1)$. Similarly, for the case of FIG. 6, M is used instead of (M-N+1) so $P_i$ would be the integer rounding up or down $(M/I_i)$, while the $\text{sum}_{i=[1-N]} P_i = M$. Furthermore, in the examples of FIG. 4 and FIG. 5, the number of intermediate conductors $\text{sum}_{i=[1-N]} I_i$ is bounded to be at least M and if k×N is greater than M, the $\text{sum}_{i=[1-N]} I_i$ can either be M or k×N or some number in between; while each individual $I_i$ is bounded by M/N, k or some number in between and since M/N may not be integer divisible, $I_i$ is an integer by rounding up or down M/N, hence we can see that individual $I_i$ may not be uniform among all i for i=[1-N].

Figure 7:
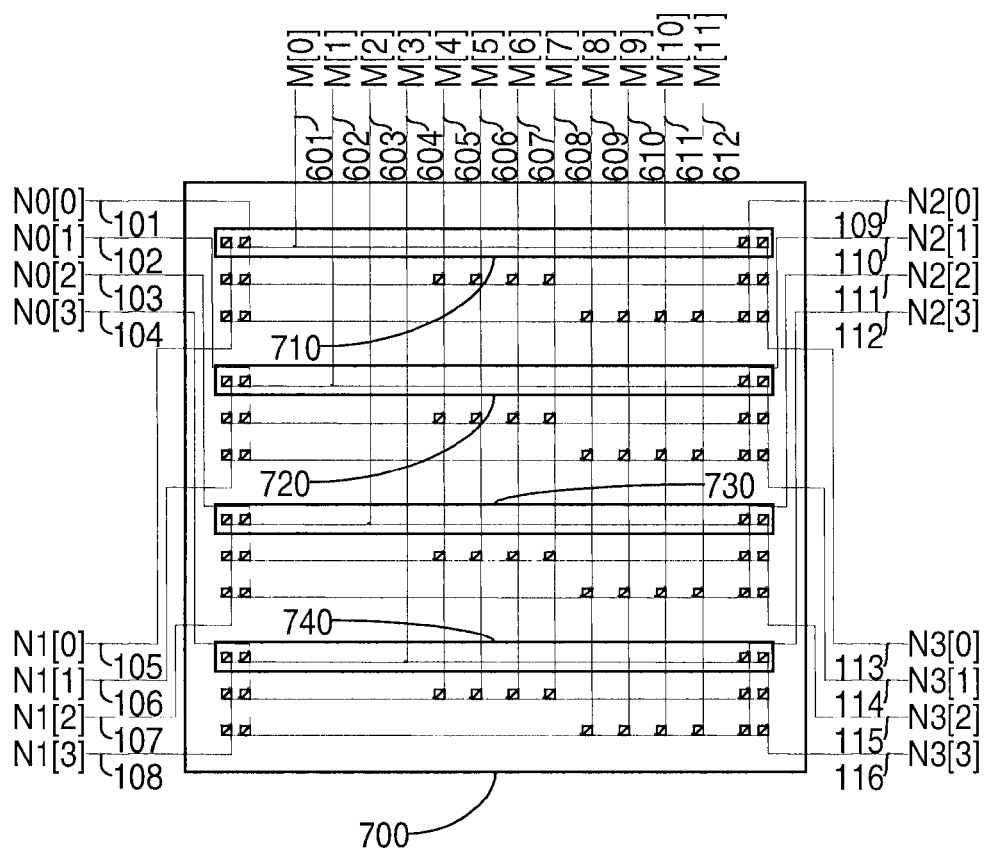
FIG. 7 illustrates one embodiment of a reduced stage-1 scalable non-blocking switching network with fewer switches.

FIG. 7 illustrates an embodiment where the number of switches in the embodiment of FIG. 6 is reduced without much change to the connectivity property of the 1-SN. FIG. 7 represents the reduction where conductor 601 is shorted to conductor 621, conductor 602 is shorted to conductor 624, conductor 603 is shorted to conductor 627, and conductor 604 is shorted to conductor 630 in FIG. 6; where the sixteen switches in sub-network 670 of FIG. 6 are deleted and the number of switches is eighty in FIG. 7 instead of ninety six in FIG. 6. The 1-SN 700 minus sub-networks 710, 720, 730 and 740 in FIG. 7 with M conductors 605-612, has the same stronger connectivity property of the 1-SN 600 described in FIG. 6 and is a 1-SN with M=8. It is possible to further reduce the number of switches, for example, by shorting more M conductors to the intermediate conductors, but the connectivity property would be much reduced and the software efforts in determining a connection pattern would become increasingly more complex.

Figure 8:
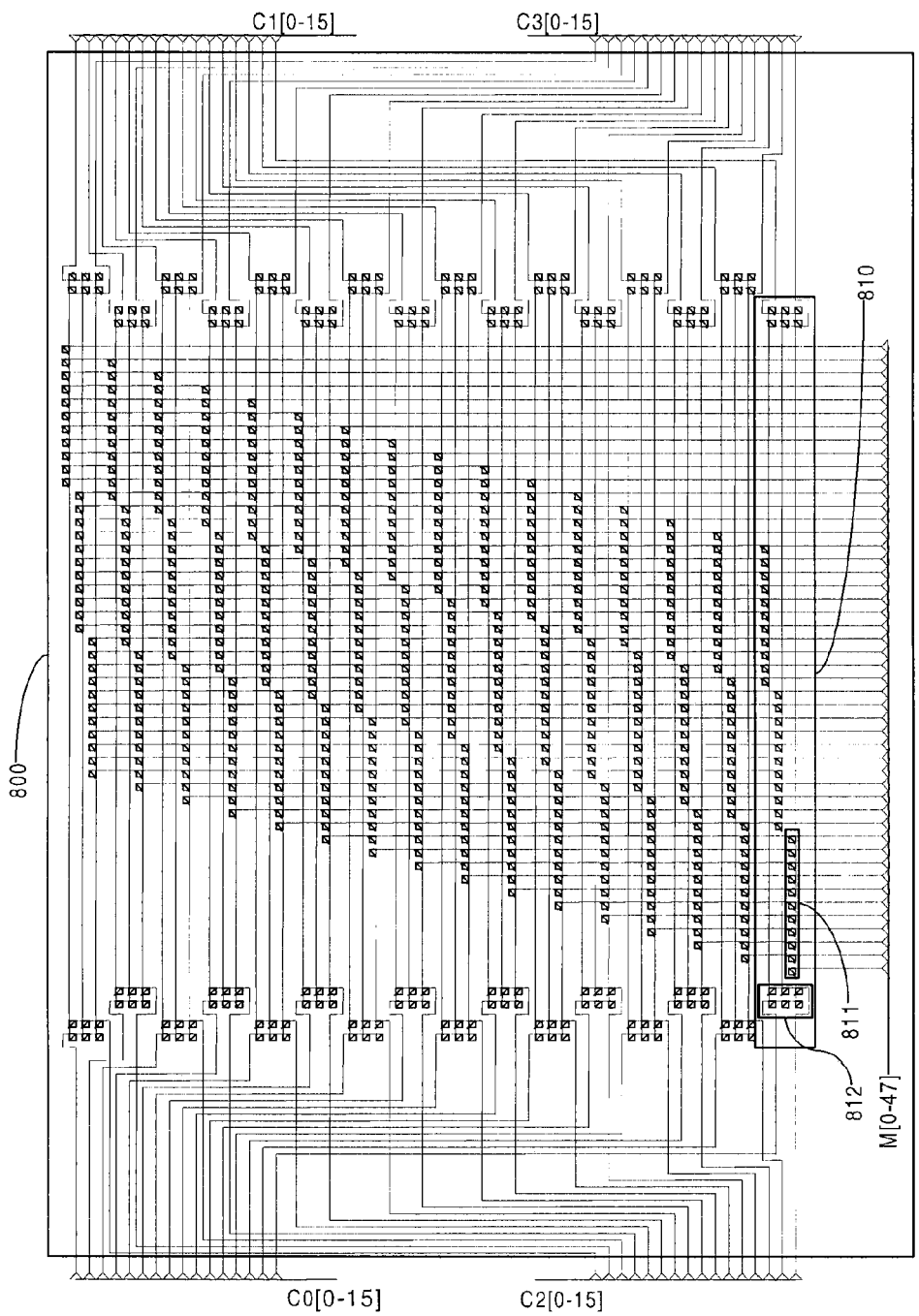
FIG. 8 illustrates one embodiment of a larger size stage-1 scalable non-blocking switching network.

FIG. 8 illustrates an embodiment of a 1-SN with M=48, k=4, N=16 and $I_i=3$ for i=[1-16]. Because there are 720 switches in 1-SN 800, a 0-SN would require 2112 switches and a cross bar would require 3072 switches. Each of the N(=16) sets of $I_i$ intermediate conductors, for example, $I_{16}$, has three conductors (inside sub-network 810) where the $I_{16}$ conductors couple to (M-N+1)=33 M conductors in FIG. 8, each of the intermediate conductors couples to eleven M conductors through the eleven switches in sub-network 811. By introducing an intermediate conductor and an extra switch in the connection path, the 1-SN 800 provides a large reduction in number of switches required compared to that of a 0-SN.

In the various embodiments examples have been used where M is less than k×N and M conductors are the conductors carrying fan-in signals while the k sets of N conductors are the conductors to receive those fan-in signals. This need not be the case. We can simply have a SN where M is larger than k×N. Alternatively, we can consider, for example, the conductors 101-104, 105-108, 109-112 and 113-116 in FIG. 6 as sixteen outputs from four clusters of logic cells and using the 1-SN for the purpose of output reduction from sixteen to twelve where any subset of twelve outputs out of sixteen outputs can be selected using the 1-SN. Additionally, the conductors 101-104, 105-108, 109-112 and 113-116 in the various figures need not be either inputs or outputs of logic cells but may be a plurality of equivalent conductors where connection to any of the conductor in one plurality of equivalent conductors is sufficient as opposed to connection to a particular conductor in the plurality of equivalent conductors.

In designing interconnection architecture for programmable logic circuits, it may be important to provide reasonable connectivity and adequate interconnection resources based on engineering trade-offs such a circuit size, speed and ease of software to place and route a customer specified design. There is a ratio R between the M conductors and the k sets of N conductors where R=M/(k×N); if R is too small, the connectivity is more limited than a larger R. The circuit in FIG. 6, for example, has R=0.75. We shall call R the expansion exponent in building up the hierarchy of circuits using scalable non-blocking switching networks. A commonly used expansion exponent, for the design of a programmable logic circuits using the scalable non-blocking switching networks, is in the range between 0.5 and 1.0 and the choice is dependent on factors such as engineering design trade-offs (i.e., logic utilization, circuit area minimization, ease of software place and route, etc.), technology used (i.e., SRAM, anti-fuse, etc.), etc. It is sometimes advantageous to exceed the range in parts of the circuits, for example, in an output reduction where a large number of outputs are reduced to a lesser number using a SN.

The previous discussion dealt with using 0-SN and 1-SN which can be used to build up a circuit hierarchy for the interconnect of programmable logic cells whereby each level of hierarchy contains several programmable logic circuits with associated 0-SN and/or 1-SN to connect to various conductors throughout the circuits using the various scalable non-blocking switching networks. The previously described schemes allow connection to an arbitrary signal at any level of circuit hierarchy to reach an input of any of the logic cells within the hierarchy using the 0-SNs and the 1-SNs as long as interconnect resources and logic capacities remain available.

Figure 9:
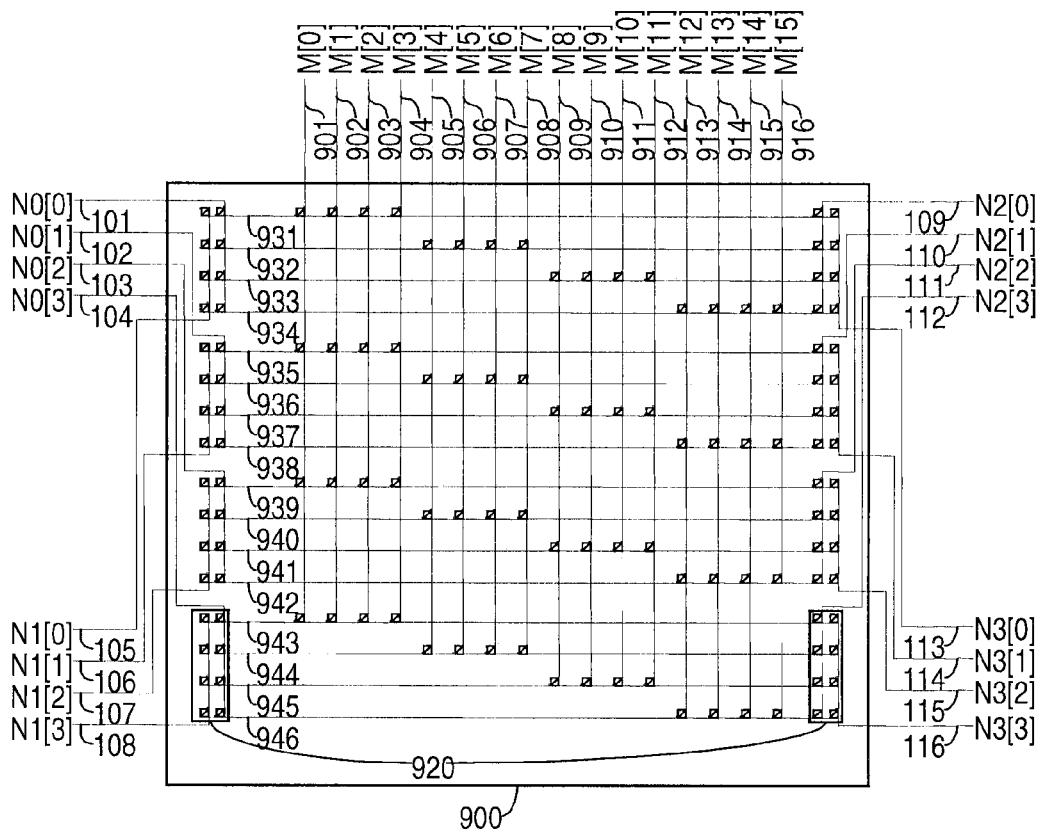
FIG. 9 illustrates one embodiment of a stage-1 scalable non-blocking switching network with sixteen M conductors.

Below is described a scheme in building up a programmable logic circuit using stage-1 and stage-2 scalable non-blocking switching networks hierarchically. FIG. 9 illustrates an embodiment of the MTX circuit 200 in the CLST4 circuit 100 in FIG. 1 using a stage-1 scalable non-blocking switching network with sixteen M conductors 901-916, four sets of N conductors 101-104, 105-108, 109-112, 113-116 where N=4, and N sets of $I_i$ conductors 931-934, 935-938, 939-942, 943-946, for i=[1-N] where each $I_i=M/N=4$; the expansion exponent R is 1.0 in the embodiment of FIG. 9.

By construction in building a programmable circuit, for example, using a 1-SN 900 of FIG. 9, any subset of the M conductors 901-916 can be individually connected through the 1-SN 900 to one conductor in each of the k sets of N conductors. Those M conductors themselves then become logically equivalent. For any signal originating somewhere outside the CLST4 circuit 100 of FIG. 1 to connect up to four inputs from each of the four logic cells 10-40 (one from conductors 101-104, one from conductors 105-108, one from conductors 109-112, and one from conductors 113-116) of FIG. 1; it is only necessary to connect to one of the M conductors. Thus, those M conductors 901-916 can be treated hierarchically as the N conductors (where N=16) where multiple new k sets of those new N conductors each having a circuit including four logic cells and two Flip Flops together with the 1-SN are to be selectively connected through a new switch network such as a SN by a new set of M conductors. This process can be repeated till a desired circuit size is reached while the desired circuit allows unrestricted connectivity as discussed above.

Figure 10:
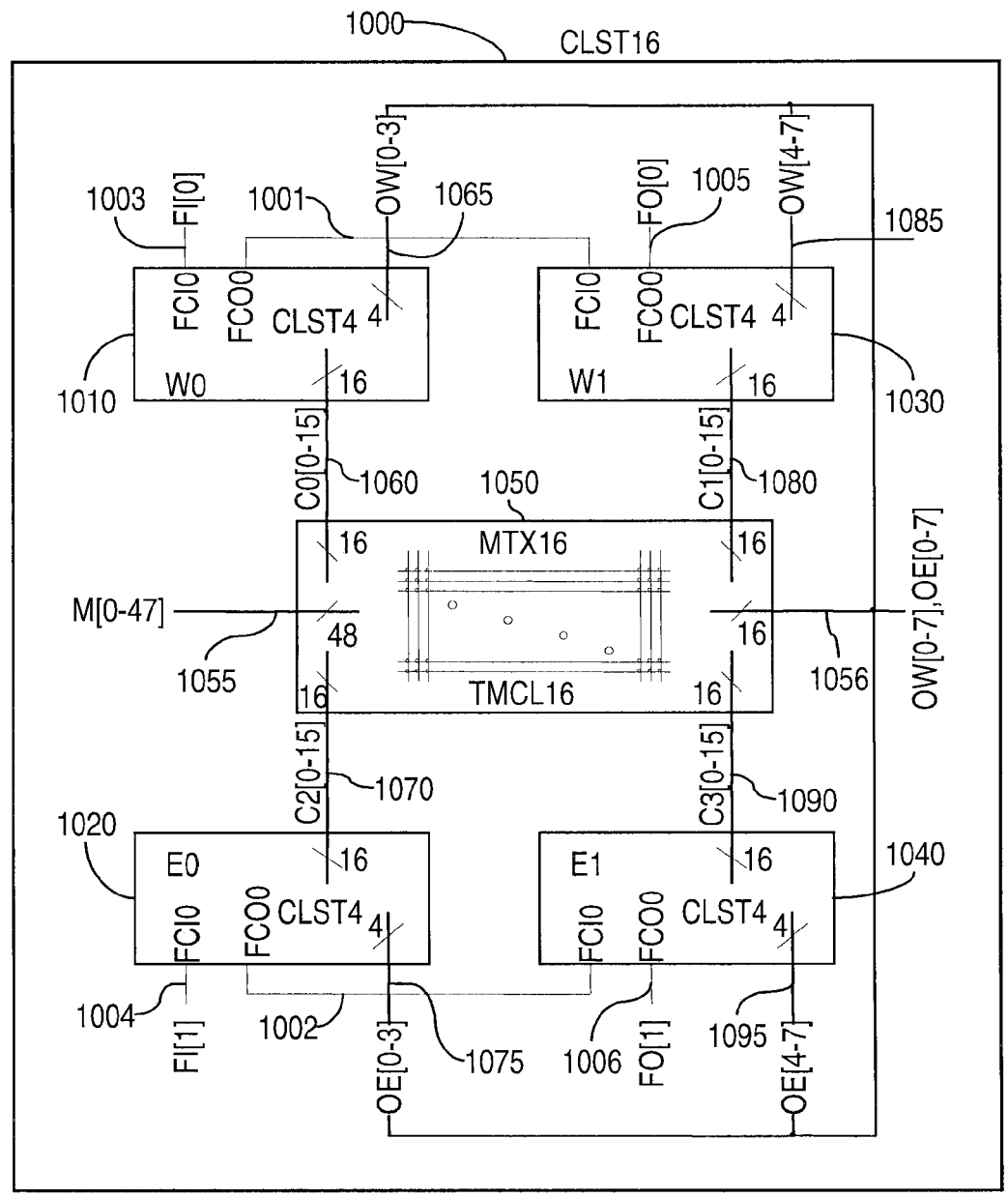
FIG. 10 is a block diagram illustrating one embodiment of a stage-2 scalable non-blocking switching network (2-SN) and a circuit with four logic circuits of FIG. 1, each using the scalable non-blocking switching network of FIG. 9.

FIG. 10 illustrates a block diagram embodiment of a next level of circuit hierarchy CLST16 1000 using four sets of CLST4 100 of FIG. 1 (CLST4 1010, CLST4 1020, CLST4 1030, CLST4 1040 of FIG. 10) where circuit MTX 200 is implemented using the 1-SN 900 of FIG. 9 and a stage-2 scalable non-blocking switching network of circuit MTX16 1050 with sixty four M conductors having forty eight conductors 1055 (M[0-47]) and sixteen conductors 1056 (OW[0-7], OE[0-7]) and four sets of N conductors 1060, 1070, 1080, 1090 where each of the N conductors has sixteen conductors which correspond to the sixteen M conductors 901-916 of FIG. 9. In FIG. 10, sixteen conductors 1056 of the sixty four M conductors 1055 and 1056 directly connect to the four outputs 1065, 1075, 1085, 1095 of the four CLST4 100 circuits 1010, 1020, 1030, 1040. The sixteen conductors 1056 (OW[0-7], OE[0-7]) having four sets of four conductors and each of the four conductors corresponds to the four outputs 125-128 (O[0-3]) of the CLST4 100 circuit of FIG. 1. The expansion exponent R is again 1.0 in this circuit 1000.

Figure 11A:
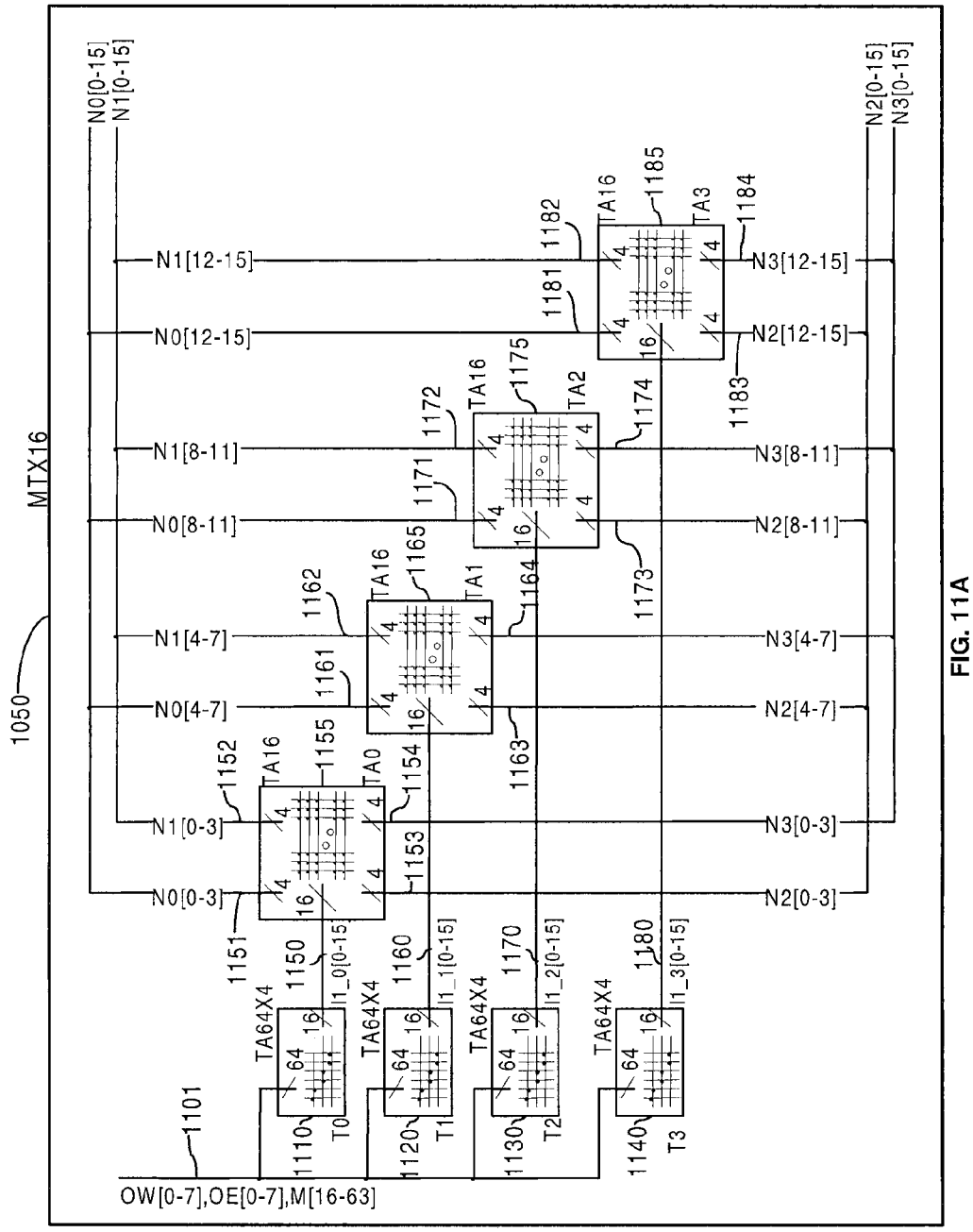
FIG. 11A illustrates a block diagram embodiment of the stage-2 scalable non-blocking switching network of FIG. 10.
Figure 11B:
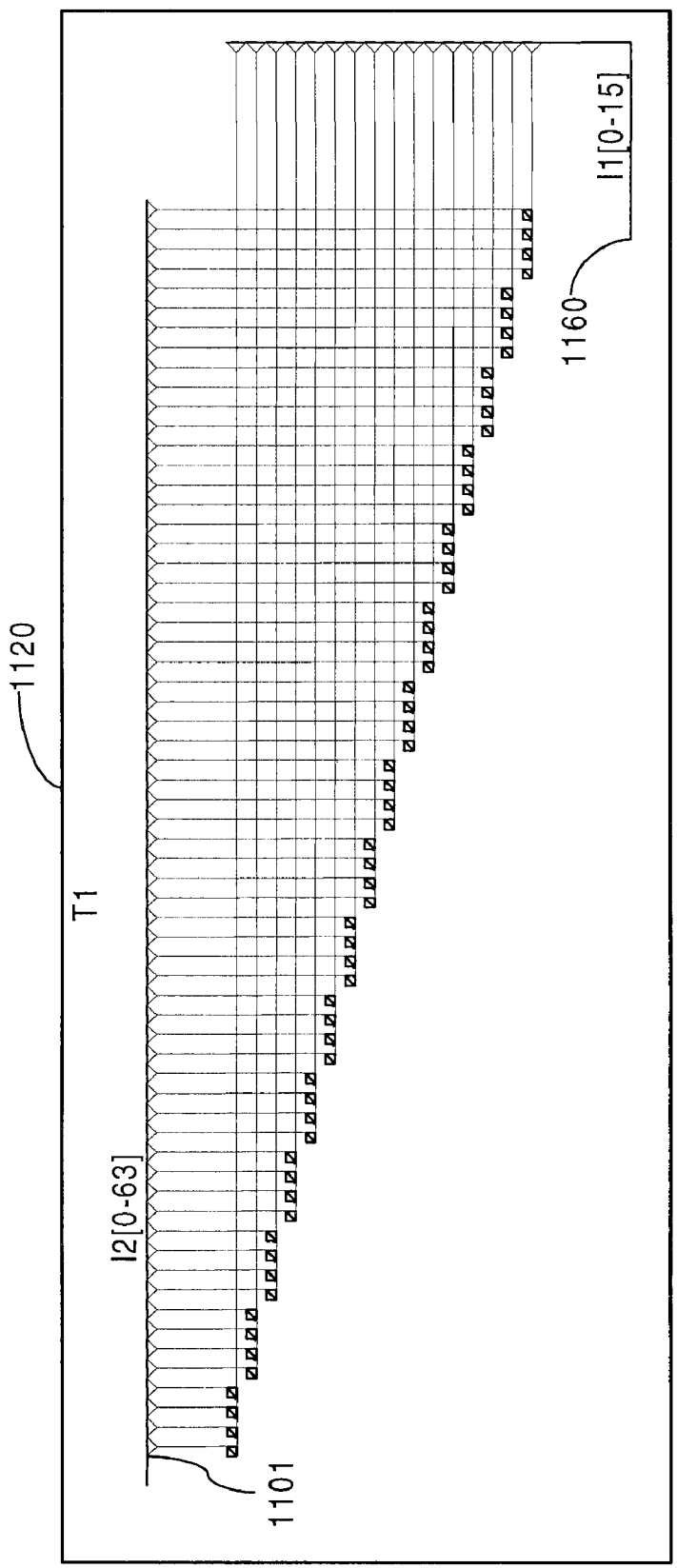
FIG. 11B illustrates one embodiment of the first part of the stage-2 scalable non-blocking switching network of FIG. 11A.

The use of scalable non-blocking switching networks in this next level of circuit hierarchy, connecting large number of conductors to multiple sets of conductors, is illustrated in FIG. 11A. FIG. 11A illustrates an embodiment, in block diagram form, of circuit MTX16 1050 of FIG. 10 where the sixty four M conductors 1101 (M[0-47], OW[0-7], OE[0-7]) correspond to conductors 1055 and 1056 of FIG. 10. The first stage of intermediate conductors is composed of N0 (where N0=4) sets of sixteen $I0_i$ conductors (where $I0_i$=M/N0=16 for i=[1–N0]) 1150, 1160, 1170, and 1180. The M conductors 1101 interface to the first four sets of intermediate stage $I0_i$ conductors 1150, 1160, 1170, 1180 using the switches of sub-networks 1110, 1120, 1130 and 1140. FIG. 11B illustrates a scheme where conductors 1101 connects to conductors 1160 through sub-network 1120. The connection scheme where conductors 1101 connect to conductors 1150 through sub-network 1110, and to conductors 1170 through sub-network 1130, and to conductors 1180 through sub-network 1140 are the same as sub-network 1120 of FIG. 11B. The number of switches used between the M conductors 1101 to the four sets of first stage intermediate conductors 1150, 1160, 1170, 1180 in this embodiment is M×N0=256. As described in relation to FIG. 5, an alternative implementation is to have (M−N0+1)×N0 switches instead.

Figure 12:
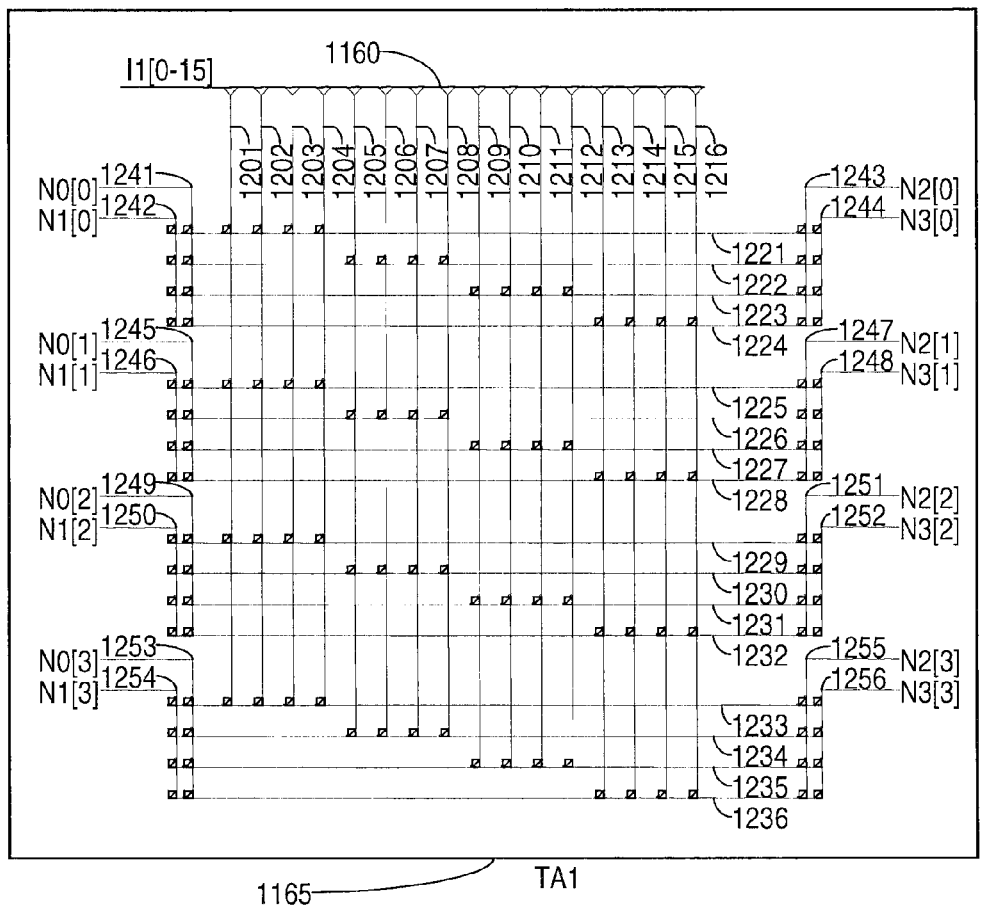
FIG. 12 illustrates one embodiment of a stage-1 scalable non-blocking switching network implementing the second part of the 2-SN of FIG. 11A.

FIG. 12 illustrates an embodiment of circuit TA1 1165 where conductors 1160 is the second N0 set of $I0_i$ conductors, where i=2 and $I0_i$=16; intermediate conductors 1201-1216 (which correspond to conductors 1160 of FIG. 11A) interface to sixteen conductors 1241-1256 (which correspond to conductors 1161-1164 of FIG. 11A). Sub-networks 1155, 1175, 1185 of FIG. 11A are the same circuit as sub-network 1165 to interconnect conductors 1150, 1170, 1180 to conductors 1151-1154, 1171-1174, 1181-1184 of FIG. 11A, respectively.

In FIG. 12, the circuit TA1 is a 1-SN 1165 of FIG. 11A where M conductors 1201-1216 are the sixteen intermediate $I0_2$ conductors 1160 ($I1_{-1}$[0-15]) of FIG. 11A; sixteen intermediate conductors 1221-1236 are composed of N1 (=4) sets of $I1_{2j}$ ($I1_{2j}$=M/N1=4) conductors for i=2, j=[1–N1]: conductors 1221-1224, 1225-1228, 1229-1232, 1233-1236. The $I1_{2j}$ conductors connects to the four sets of destination conductors 1241-1244, 1245-1248, 1249-1252, 1253-1256 for j=[1–N1], respectively. The 1-SN 1165 of FIG. 12 uses the same 1-SN 900 of FIG. 9. However, the 1-SN 1165 is one of four (sub-networks 1155, 1165, 1175, 1185) in a second part of a stage-2 scalable non-blocking switching network (2-SN) 1050 of FIG. 11A where the conductors 1151-1154, 1161-1164, 1171-1174, 1181-1184 of the 2-SN are the M conductors 1060, 1070, 1080, 1090 of the CLST4 circuits 1010, 1020, 1030, 1040, respectively of FIG. 10. Each of the CLST4 circuits 1010, 1020, 1030, 1040 corresponds to the CLST4 circuit 100 of FIG. 1 along with the 1-SN 900 of FIG. 9.

The TA1 circuit 1165 of FIG. 12 connects conductors 1201-1216 selectively to conductors 1241-1256; 1241, 1245, 1249, 1253 that are conductors 1161 (N0[4-7]) of FIG. 11A which correspond to four of the sixteen M conductors 1060 (C0[4-7] of C0[0-15]) of CLST4 1010 of FIG. 10. Similarly, conductors 1242, 1246, 1250, 1254 are conductors 1162 (N1 [4-7]) of FIG. 11A which correspond to four of the sixteen M conductors 1080 (C1[4-7] of C1[0-15]) of CLST4 1030 of FIG. 10. Conductors 1243, 1247, 1251, 1255 are conductors 1163 (N2[4-7]) of FIG. 11A which correspond to four of the sixteen M conductors 1070 (C2[4-7] of C2[0-15]) of CLST4 1020 of FIG. 10. Conductors 1244, 1248, 1252, 1256 are conductors 1164 (N3[4-7]) of FIG. 11A which correspond to four of the sixteen M conductors 1090 (C3[4-7] of C3[0-15]) of CLST4 1040 of FIG. 10.

In a 1-SN implementation of the MTX 1050 circuit of FIG. 11A, M=64, k=4, and N=16, and in the 2-SN implementation, the number of sets of each stage of intermediate conductors N0=4 and N1=4 where the product N0×N1 is equal to N. The number of switches in the 2-SN 1050 of FIG. 10 using a stronger connectivity SN discussed in FIG. 6 and FIG. 9 is M×N0+$sum_{i32\ [1-N0]}$ [($I0_i$×N1)+$sum_{j=[1-N1]}$ ($I1_{ij}$×($I0_i$/N1))] where $I0_i$=M/N0 for i=[1–N0], and $I1_{ij}$=$I0_i$/N1 for i=[1–N0], j=[1–N1] in network 1050 so $I0_i$=16, $I1_{ij}$=4 and the 2-SN of 1050 has 768 switches. A 1-SN implementation would require 1280 switches, and a full cross bar switch would require 4096 switches. In the case where each $I0_i$ conductors interface to (M−N0+1) instead of M of the M conductors, and for each $I1_{ij}$ conductors interface to ($I0_i$−N1+1) instead of $I0_i$ of the $I0_i$ conductors, the number of switches would be (M−N0+1)×N0+$sum_{i=[1-N0]}$ [($I0_i$−N1+1)×N1)+$sum_{j=[1-N1]}$ ($I0_i$/N1))]. In the FIG. 10 case, we have N=N0×N1, $I0_i$=M/N0, $I1_{ij}$=M/N=k, thus the number of switches in this case for the 2-SN is [M×(N0+N1+k)].

As discussed earlier, each of the N conductors of the k sets of N conductors in the different SNs does not need to be of uniform size. A SN can be constructed with different sized $N_i$'s where the maximum sized $N_i$ is used as the uniform sized new N and virtual conductors and switches can be added to the smaller sized $N_i$ making the $N_i$ appear to be of size N. Since the interconnection specification will not require the smaller sized $N_i$ to have more connections than $N_i$, there is no change in the connectivity property of the SN. As an example, in FIG. 1 instead of four sets of N conductors 101-104, 105-108, 109-112, 113-116 as inputs for logic cells 10-40, respectively, logic cell 10 of FIG. 1 has only three inputs 101-103. In SN of FIG. 6 with M conductors 601-612, switches in FIG. 6 and intermediate conductors 621-632 stay the same, with the exception that the three switches in sub-network 680 and conductor 104 are "virtual" and can be taken out of the SN in FIG. 6.

Multiple stages of scalable non-blocking switching networks can be built using the schemes described above, for example, the MTX 1050 of FIG. 10 can be implemented as a stage-3 scalable non-blocking switching network using N0=2, N1=2 and N2=4 with first intermediate $I0_i$ conductors $I0_i$=M/N0, $I1_{ij}$=$I0_i$/N1 and $I2_{ijk}$=$I1_{ij}$/N2 for i=[1−N0], j=[1−N1] and k=[1−N2], where N0×N1×N2=N=16 which is the number of inputs for each of the four CLST4 circuits 1010, 1020, 1030, 1040 of FIG. 10. Similarly, SN 1050 can be implemented as a stage-4 SN where N0=2, N1=2, N2=2 and N3=2 with four intermediate stages of conductors connecting the M conductors to the N conductors. The 2-SN implementation over the 1-SN implementation in SN 1050 of FIG. 10 has a reduction in the number of switches by the difference between N×M=16M and (N0+N1)×M=(4+4)×M=8M; the 3-SN and 4-SN where (N0+N1+N2)=(2+2+4)=8 and (N0+N1+N2+N3)=(2+2+2+2)=8, respectively, has no improvement over the 2-SN where (N0+N1)=(4+4)=8. As such, it may make sense only when the sum of Ni, the number of sets of the intermediate conductors for each stage, add up to be less than the previous stage multi-stage SN. Thus, it can be seen that for N=64, a 3-SN using N0=N1=N2=4 where (N0+N1+N2)=12 would be very effective in switch reduction over a 2-SN using N0=N1=8 with (N0+N1)=16 and similarly for the 2-SN over 1-SN where N=64.

Thus we have described two levels of circuit hierarchy using scalable non-blocking switching networks where sixty four M conductors fan in to connect, through a 2-SN and then a 1-SN, to sixteen four-input logic cells. Sixteen of the sixty four M conductors are directly connected to the sixteen outputs of each of the four CLST4 (125-128 of 100 in FIG. 1) circuits, providing unrestricted connections from any output to all sixteen logic cells. The first level of circuit hierarchy includes the circuit CLST4 100 of FIG. 1 with MTX 200 implemented as the 1-SN 900 of FIG. 9 where CLST4 100 has four four-input logic cells 10-40 and two flip-flops 50, 60 as shown in FIG. 1. The next higher second level of circuit hierarchy is the CLST16 1000 circuits of FIG. 10 having four CLST4 100 circuits with a 2-SN MTX16 1050 as shown in FIG. 10, where the network 1050 implementation is illustrated in FIG. 11A, FIG. 11B and FIG. 12. In CLST16 1000, each of sixteen outputs 1065, 1075, 1085, 1095 (connecting directly to conductors 1056) has unrestricted connectivity to every logic cell in the CLST16 1000 circuit and the other 48 M conductors 1055 of FIG. 10 can be treated as the N conductors of the CLST16 1000 in building up the next level of circuit hierarchy. The sixteen outputs 125-128 of CLST4 100 in FIG. 1 for each of the four CLST4 circuits 1010, 1020, 1030, 1040 of FIG. 10 are directly wired to sixteen M conductors 1056, whose outputs can further connect, through a SN, to the next third level of circuit hierarchy using CLST16 1000 circuits as building blocks and the forty-eight other M conductors are the equivalent pins or input conductors for the CLST 1000 circuits to provide continued high connectivity in the programmable logic circuit.

The CLST 1000 circuit of FIG. 10 is illustrated using a 2-SN cascading four 1-SNs with sixty four M conductors 1055, 1056 and sixteen four-input logic cells organized in four groups 1010, 1020, 1030, 1040 using a total of 1280 switches amongst the various SNs: SN 1050 of FIG. 10 and SN 200 of FIG. 1 for each group 1010-1040 of FIG. 10. The CLST 1000 circuit of FIG. 10 can have an alternative implementation using a 1-SN with sixty four M conductors, k (e.g., 16) plurality of N (e.g., 4) conductors using the methods discussed in FIG. 9. The number of switches is M×(N+k)=1280 using the analysis discussed herein. It turns out, in this case, both the 1-SN implementation and the embodiment of FIG. 10 has the same number of switches.

The decision in determining which implementation is more suitable will depend on engineering considerations such as: whether a four-input MUX implementation with more intermediate stages of conductors in the FIG. 10 embodiment or sixteen-input MUX and less number of intermediate stages of conductors in the 1-SN implementation is more preferable using SRAM technology, whether one style is more suitable in layout implementation, etc. It is important to note, based on the above analysis, that it is preferable to have a reasonable sized base array of logic cells connecting through a SN so the overhead, in total switch count, in stitching up several base arrays of logic cells using another SN in the next level of circuit hierarchy does not exceed implementing a larger sized base array of logic cells. In most programmable logic circuits, a base logic cell (of a logic cell array with a SN) usually has either three inputs or four inputs, and it is reasonable to see, from the illustrated examples discussed above, the number of logic cells, k, in the base logic array should not be a small number, or rather, depending upon the size of N, k×N should be of reasonable size (e.g., the CLST4 100 circuit of FIG. 1) for a SN to be used efficiently as the interconnect network.

Using numerous embodiments and illustrations, a detailed description in building various scalable non-blocking switching networks is provided and used in various combinations to provide interconnect, both for inputs and outputs, for programmable logic circuits. Depending on technology and engineering considerations, variations in implementation of the scalable non-blocking switching networks may be used, including, but not exclusive of, the use of MUXs to reduce number of memory controls, switch reductions, etc.

What is claimed is:
1. An integrated circuit, comprising a L-level permutable switching network (L-PSN);
    wherein the L-PSN comprises an 0-th level of I[0] number of conductors selectively coupling a (L+1)-th level of I[L+1] number of conductors through L levels of conductors and (L+1) sets of switches for L≧1:
    wherein the L levels of conductors comprises:
        i-th level of conductors of I[i] number of conductors comprising D[i] sets of conductors and I[i−1]≦I[i] for each i selected from [1:L], wherein (I[i]/ D[i])>1, D[i]>1, and at least one j selected from [1:L] with D[j]>2;
        wherein $(I[0]/\Pi_{i=[1:L]}D[i])>1$;
    wherein the I[L+1] number of conductors comprises D[L+1] sets of conductors where D[L+1]>2,
        wherein each of the D[L+1] sets of conductors comprises $\Pi_{i=[1:L]}D[i]$ number of conductors;
    wherein the (L+1) sets of switches comprise $\Sigma_{i=[1:L+1]}$ (I[i−1]×D[i]) number of switches,
        wherein each i-th set of the (L+1) sets of switches comprises (I[i−1]×D[i]) number of switches for i=[1:L+1];
    wherein the I[i−1] number of conductors of the (i−1)-th level of conductors selectively couple to (I[i]/D[i]) number of conductors in each of the D[i] sets of conductors of the i-th level of conductors through a respective I[i−1]

number of switches of the i-th set of switches for i=[1:L+1] without requiring traversal of any other conductors;

wherein the $\Pi_{i=[1:L]}$ D[i] number of conductors in each of the D[L+1] sets of conductors of the (L+1)-th level of conductors are physically connected to a corresponding number of pins of a corresponding module selected from switching networks and logic cells; and at least one j selected from [1:L+1], $D_S[j]=D[j]\times(I[j-1]/I[j])$, wherein each conductor in each of the D[j] sets of conductors of the I[j] number of conductors of the j-th level of conductors selectively couples to $D_S[j]$ number of conductors of the I[j−1] number of conductors of the (j−1)-th level of conductors through a respective $D_S[j]$ number of switches of the j-th set of switches without requiring traversal of any other conductors, wherein a D[j] number of conductors comprising one conductor selected from each of the D[j] sets of conductors, wherein each conductor of the D[j] number of conductors selectively couples, through a respective $D_S[j]$ number of switches of the j-th set of switches, a same $D_S[j]$ number of conductors of the I[j−1] number of conductors without requiring traversal of any other conductors.

2. The integrated circuit of claim 1, wherein the I[j−1] number of conductors of the (j−1)-th level of conductors comprises (I[j−1]/$D_S[j]$) groups of $D_S[j]$ number of conductors, and wherein the $D_S[j]$ number of conductors of each of the (I[j−1]/$D_S[j]$) groups selectively couple to one conductor in each of the D[j] sets of conductors of the I[j] number of conductors of the j-th level of conductors through a respective $D_S[j]$ number of switches of the j-th set of switches without requiring traversal of any other conductors.

3. The integrated circuit of claim 1, wherein the I[j] number of conductors of the j-th level of conductors comprises (I[j]/D[j]) groups of D[j] number of conductors, wherein the D[j] number of conductors of the (I[j]/D[j]) groups comprising one conductor selected from each of the D[j] sets of conductors; and wherein the D[j] number of conductors of each of the (I[j]/D[j]) groups selectively couple, through (D[j]×$D_S[j]$) number of switches of the j-th set of switches, a same $D_S[j]$ number of conductors without requiring traversal of any other conductors.

4. A method of manufacturing an integrated circuit, comprising:

fabricating a L-level permutable switching network (L-PSN), wherein the L-PSN comprises an 0-th level of I[0] number of conductors selectively coupling a (L+1)-th level of I[L+1] number of conductors through L levels of conductors and (L+1) sets of switches for L≧1:

wherein the L levels of conductors comprises:

i-th level of conductors of I[i] number of conductors comprising D[i] sets of conductors and I[i−1]≦I[i] for each i selected from [1:L], wherein (I[i]/ D[i])>1, D[i]>1, and at least one j selected from [1:L] with D[j]>2;

wherein (I[0]/$\Pi_{i=[1:L]}$D[i])>1;

wherein the I[L+1] number of conductors comprises D[L+1] sets of conductors where D[L+1]>2, wherein each of the D[L+1] sets of conductors comprises $\Pi_{i=[1:L]}$D[i] number of conductors;

wherein the (L+1) sets of switches comprise $\Sigma_{i=[1:L+1]}$ (I[i−1]×D[i]) number of switches, wherein each i-th set of the (L+1) sets of switches comprises (I[i−1]×D[i]) number of switches for i=[1:L+1];

selectively coupling the I[i−1] number of conductors of the (i−1)-th level to (I[i]/ D[i]) number of conductors in each of the D[i] sets of conductors of the i-th level of conductors through a respective I[i−1] number of switches of the i-th set of switches for i =[1:L+1] without requiring traversal of any other conductors;

physically connecting the $\Pi_{i=[1:L]}$ D[i] number of conductors in each of the D[L+1] sets of conductors of the (L+1)-th level of conductors to a corresponding number of pins of a corresponding module selected from switching networks and logic cells; and selecting at least one j=[1:L+1], $D_S[j]=D[j]\times(I[j-1]/I[j])$, selectively coupling each conductor in each of the D[j] sets of conductors of the I[j] number of conductors of the j-th level of conductors to $D_S[j]$ number of conductors of the I[j−1] number of conductors of the (j−1)-th level of conductors through a respective $D_S[j]$ number of switches of the j-th set of switches without requiring traversal of any other conductors, wherein a D[j] number of conductors comprising one conductor selected from each of the D[j] sets of conductors, and selectively coupling each conductor of the D[j] number of conductors, through a respective $D_S[j]$ number of switches of the j-th set of switches, to a same $D_S[j]$ number of conductors of the I[j−1] number of conductors without requiring traversal of any other conductors.

5. The method of claim 4, wherein the I[j−1] number of conductors of the (j−1)-th level of conductors comprises (I[j−1]/$D_S[j]$) groups of $D_S[j]$ number of conductors, and selectively coupling the $D_S[j]$ number of conductors of each of the (I[j−1]/$D_S[j]$) groups to one conductor in each of the D[j] sets of conductors of the I[j] number of conductors of the j-th level of conductors through a respective $D_S[j]$ number of switches of the j-th set of switches without requiring traversal of any other conductors.

6. The method of claim 4, wherein the I[j] number of conductors of the j-th level of conductors comprises (I[j]/D[j]) groups of D[j] number of conductors, selecting the D[j] number of conductors comprising one conductor from each of the D[j] sets of conductors; and selectively coupling the D[j] number of conductors of each of the (I[j]/D[j]) groups, through (D[j]×$D_S[j]$) number of switches of the j-th set of switches, to a same $D_S[j]$ number of conductors without requiring traversal of any other conductors.

7. A non-transistory machine readable storage medium that stores data representing an integrated circuit layout, comprising: a L-level permutable switching network (L-PSN);

wherein the L-PSN comprises an 0-th level of I[0] number of conductors selectively coupling a (L+1)-th level of I[L+1] number of conductors through L levels of conductors and (L+1) sets of switches for L≧1:

wherein the L levels of conductors comprises:

i-th level of conductors of I[i] number of conductors comprising D[i] sets of conductors and I[i−1]≦I[i] for each i selected from [1:L], wherein (I[i]/ D[i])>1, D[i]>1, and at least one j selected from [1:L] with D[j]>2;

wherein (I[0]/$\Pi_{i=[1:L]}$ D[i])>1;

wherein the I[L+1] number of conductors comprises D[L+1] sets of conductors where D[L+1]>2, wherein each of the D[L+1] sets of conductors comprises $\Pi_{i=[1:L]}$ D[i] number of conductors;

wherein the (L+1) sets of switches comprise $\Sigma_{i=[1:L+1]}$ (I[i−1]×D[i]) number of switches, wherein each i-th set of the (L+1) sets of switches comprises (I[i−1]×D[i]) number of switches for i=[1:L+1];

wherein the I[i−1] number of conductors of the (i−1)-th level of conductors selectively couple to (I[i]/D[i]) number of conductors in each of the D[i] sets of conductors of the i-th level of conductors through a respective I[i−1] number of switches of the i-th set of switches for i=[1:L+1] without requiring traversal of any other conductors;

wherein the $\Pi_{i=[1:L]}$ D[i] number of conductors in each of the D[L+1] sets of conductors of the (L+1)-th level of conductors are physically connected to a corresponding number of pins of a corresponding module selected from switching networks and logic cells; and at least one j selected from [1:L+1], $D_S[j]$=D[j]×(I[j−1]/I[j]), wherein each conductor in each of the D[j] sets of conductors of the I[j] number of conductors of the j-th level of conductors selectively couples to $D_S[j]$ number of conductors of the I[j−1] number of conductors of the (j−1)-th level of conductors through a respective $D_S[j]$ number of switches of the j-th set of switches without requiring traversal of any other conductors, wherein a D[j] number of conductors comprising one conductor selected from each of the D[j] sets of conductors, wherein each conductor of the D[j] number of conductors selectively couples, through a respective $D_S[j]$ number of switches of the j-th set of switches, a same $D_S[j]$ number of conductors of the I[j−1] number of conductors without requiring traversal of any other conductors.

8. The non-transitory machine readable medium of claim 7, wherein the I[j−1] number of conductors of the (j−1)-th level of conductors comprises (I[j−1]/$D_S[j]$) groups of $D_S[j]$ number of conductors, and wherein the $D_S[j]$ number of conductors of each of the (I[j−1]/$D_S[j]$) groups selectively couple to one conductor in each of the D[j] sets of conductors of the I[j] number of conductors of the j-th level of conductors through a respective $D_S[j]$ number of switches of the j-th set of switches without requiring traversal of any other conductors.

9. The non-transitory machine readable medium of claim 7, wherein the I[j] number of conductors of the j-th level of conductors comprises (I[j]/D[j]) groups of D[j] number of conductors, wherein the D[j] number of conductors comprising one conductor selected from each of the D[j] sets of conductors; and wherein the D[j] number of conductors of each of the (I[j]/D[j]) groups selectively couple, through (D[j]×$D_S$[j]) number of switches of the j-th set of switches, a same $D_S[j]$ number of conductors without requiring traversal of any other conductors.

* * * * *